(12) United States Patent
Tanaka et al.

(10) Patent No.: US 7,888,242 B2
(45) Date of Patent: Feb. 15, 2011

(54) FORMATION METHOD OF SINGLE CRYSTAL SEMICONDUCTOR LAYER, FORMATION METHOD OF CRYSTALLINE SEMICONDUCTOR LAYER, FORMATION METHOD OF POLYCRYSTALLINE LAYER, AND METHOD FOR MANUFACTURING SEMICONDUCTOR DEVICE

(75) Inventors: Koichiro Tanaka, Kanagawa (JP); Satoru Okamoto, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 242 days.

(21) Appl. No.: 12/257,448

(22) Filed: Oct. 24, 2008

(65) Prior Publication Data

US 2009/0111247 A1 Apr. 30, 2009

(30) Foreign Application Priority Data

Oct. 29, 2007 (JP) .............................. 2007-280115

(51) Int. Cl.
*H01L 21/20* (2006.01)
*H01L 21/36* (2006.01)
(52) U.S. Cl. .................... 438/478; 438/479; 250/492.2; 250/492.21
(58) Field of Classification Search ................. 438/478, 438/479; 250/492.2, 492.21
See application file for complete search history.

(56) References Cited

U.S. PATENT DOCUMENTS

| 6,100,166 A | 8/2000 | Sakaguchi et al. |
| 6,534,382 B1 | 3/2003 | Sakaguchi et al. |
| 2003/0203547 A1* | 10/2003 | Sakaguchi et al. .......... 438/151 |

FOREIGN PATENT DOCUMENTS

| EP | 0 849 788 A2 | 6/1998 |
| JP | 09-255487 | 9/1997 |

(Continued)

OTHER PUBLICATIONS

International Search Report for PCT/JP2008/069705(PCT11015) Dated Feb. 3, 2009.

(Continued)

*Primary Examiner*—Zandra Smith
*Assistant Examiner*—Jamie Niesz
(74) *Attorney, Agent, or Firm*—Nixon Peabody LLP; Jeffrey L. Costellia

(57) ABSTRACT

A method for forming a single crystal semiconductor layer in which a first porous layer and a second porous layer are formed over a single crystal semiconductor ingot, a groove is formed in a part of the second porous layer and a single crystal semiconductor layer is formed over the second porous layer, the single crystal semiconductor ingot is attached onto a large insulating substrate, water jet is directed to the interface between the first porous layer and the second porous layer, and the single crystal semiconductor layer is attached to the large insulating substrate, or a method for forming a crystalline semiconductor layer in which a crystalline semiconductor ingot is irradiated with hydrogen ions to form a hydrogen ion irradiation region in the crystalline semiconductor ingot, the crystalline semiconductor ingot is rolled over the large insulating substrate while being heated, the crystalline semiconductor layer is separated from the hydrogen ion irradiation region, and the crystalline semiconductor layer is attached to the large insulating substrate.

21 Claims, 28 Drawing Sheets

| | FOREIGN PATENT DOCUMENTS | | |
|---|---|---|---|
| JP | 10-081998 | | 3/1998 |
| JP | 10081998 | * | 3/1998 |
| JP | 10-233352 | | 9/1998 |
| JP | 11-163363 | | 6/1999 |
| JP | 2007-180196 | | 7/2007 |

OTHER PUBLICATIONS

Written Opinion (Application No. PCT/JP2008/069705(PCT11015) Dated Feb. 3, 2009.

* cited by examiner 201  202

203

211

204

211

205

211

206

FORMATION METHOD OF SINGLE CRYSTAL SEMICONDUCTOR LAYER, FORMATION METHOD OF CRYSTALLINE SEMICONDUCTOR LAYER, FORMATION METHOD OF POLYCRYSTALLINE LAYER, AND METHOD FOR MANUFACTURING SEMICONDUCTOR DEVICE

BACKGROUND OF THE INVENTION

1. Field of the Invention

The present invention relates to a substrate having a silicon-on-insulator (SOI) structure obtained by slicing a semiconductor layer from a crystalline semiconductor substrate and bonding it to a substrate of a different kind. In particular, the present invention relates to bonding SOI technology. The present invention relates to a method for manufacturing an SOI substrate in which a single crystal or polycrystalline semiconductor layer is bonded to a substrate having an insulating surface of glass or the like. Further, the present invention relates to a semiconductor device using a substrate that has such an SOI structure and a method for manufacturing such a semiconductor device.

2. Description of the Related Art

Instead of silicon wafers that are manufactured by thinly cutting an ingot of a single crystal semiconductor, semiconductor substrates called silicon-on-insulator (SOI) substrates have been developed, which have a thin single crystal semiconductor layer over an insulating layer and are becoming widely used as substrates for manufacturing microprocessors or the like. This is because an integrated circuit using an SOI substrate draws attention as an integrated circuit in which parasitic capacitance between drains of transistors and a substrate can be reduced, performance of the semiconductor integrated circuit can be improved, and low power consumption can be achieved.

On the other hand, attempts to form an SOI layer on an insulating substrate of glass or the like have been made. An SOI substrate in which a thin single crystal silicon layer is formed over a glass substrate having a coating film, by a hydrogen ion implantation separation method is known as one example of an SOI substrate in which an SOI layer is formed over a glass substrate (see Reference 1: Japanese Published Patent Application No. H11-163363). Also in this case, the thin silicon layer (SOI layer) is formed over the glass substrate in such a way that a microbubble layer is formed at a predetermined depth from the surface by implanting hydrogen ions into a single crystal silicon flake, bonding the glass substrate and the single crystal silicon flake, and then separating the silicon flake using the microbubble layer as a cleavage plane.

Also in the case of forming an SOI layer over an insulating substrate, a single crystal silicon layer is separated from a silicon wafer; therefore, the area of the single crystal silicon layer would depend on the area of the silicon wafer.

For example, a large display is manufactured by bonding a single crystal silicon layer to a glass substrate, a silicon wafer of φ 300 mm is commonly used, and the size of the silicon wafer is smaller than the size of the glass substrate. Therefore, the entire surface of the glass substrate cannot be covered by one silicon wafer.

Therefore, although a plurality of silicon wafers are required to be bonded onto the glass substrate, it is difficult to closely spread a plurality of silicon wafers over the glass substrate.

There is no silicon in the space between adjacent silicon wafers, so that there are constraints on circuit design, which greatly reduces latitude in design rules.

SUMMARY OF THE INVENTION

It is an object of the present invention to form a single crystal semiconductor layer having large area over a large insulating substrate.

A separation layer is provided concentrically with the top face of the cylindrical single crystal semiconductor ingot or along the side surface thereof, and the cylindrical single crystal semiconductor ingot is separated in the direction perpendicular to the central axis; thus, a single crystal semiconductor layer having large area can be obtained. That is, a single crystal semiconductor layer is separated from the cylindrical single crystal semiconductor ingot like by rotary cutting.

Alternatively, a polycrystalline semiconductor ingot is used instead of the single crystal semiconductor ingot, and a polycrystalline Layer is separated from the polycrystalline semiconductor ingot.

The present invention makes it possible to form a large single crystal semiconductor layer. Using a large single crystal semiconductor layer obtained in accordance with the present invention, a large semiconductor device using a single crystal semiconductor layer with a little variation as an active layer can be used.

Since a large single crystal semiconductor layer of the present invention does not have a region with poor crystallinity, there would be no constraints that circuits are necessarily designed to avoid production of a region with a poor crystallinity. Therefore, the constraints on the design rules of the semiconductor device are reduced.

Further, a large single crystal semiconductor layer can be formed by the present invention, more active layers can be formed from a single crystal semiconductor layer; thus, mass production of semiconductor devices is made possible.

The present invention relates to a method for forming a single crystal semiconductor layer, including the steps of anodizing a side surface of a single crystal semiconductor ingot, thereby forming a first porous layer; forming a second porous layer by changing a condition of the anodization; forming a groove in an upper part of the second porous layer, forming an epitaxially grown single crystal semiconductor layer in a region over the second porous layer other than the groove; forming a first insulating film, a second insulating film, a third insulating film using a silicon oxide film using tetraethylorthosilicate as a material over a large insulating substrate; attaching the groove over the single crystal semiconductor ingot is attached onto the third insulating film over the large insulating substrate; directing water jet to an interface between the first porous layer and the second porous layer; while rolling the single crystal semiconductor ingot, separating the single crystal semiconductor layer and the second porous layer from the single crystal semiconductor ingot; and attaching the single crystal semiconductor layer to the third insulating film; forming the first insulating film, the second insulating film, the third insulating film, the single crystal semiconductor layer, and the second porous layer over the large insulating substrate; and removing the second porous layer.

The present invention relates to a method for forming a crystalline semiconductor layer including the steps of irradiating a side surface of a crystalline semiconductor ingot with hydrogen ions in the direction perpendicular to the central axis while rolling the single crystal semiconductor ingot, thereby forming a hydrogen ion irradiation region in a tubular shape; moving the crystalline semiconductor ingot in the direction perpendicular to the central axis of the crystalline semiconductor ingot; separating a crystalline semiconductor layer from the hydrogen ion irradiation region; and attaching the crystalline semiconductor layer onto a large insulating substrate.

The present invention relates to a method for forming a crystalline semiconductor layer, including the steps of while rolling a circle columnar crystalline semiconductor ingot, irradiating the circle columnar crystalline semiconductor ingot with hydrogen ions, thereby forming a hydrogen ion irradiation region in a tubular shape; contacting and attaching an outer region of the hydrogen ion irradiation region to a large insulating substrate, so that the large insulating substrate wraps the outer region of the hydrogen ion irradiation region of the crystalline semiconductor ingot; and while heating the large insulating substrate and the crystalline semiconductor ingot, separating a crystalline semiconductor layer which is the outer region of the hydrogen ion irradiation region from the hydrogen ion irradiation region, and attaching the crystalline semiconductor layer to the large insulating substrate.

Further, the present invention relates to a method for forming a polycrystalline semiconductor layer, including the steps of irradiating a rectangular column polycrystalline semiconductor ingot with hydrogen ions, thereby forming a hydrogen ion irradiation region in the rectangular column polycrystalline semiconductor ingot; forming a first insulating film, a second insulating film, and a third insulating film using a silicon oxide film using tetraethyl orthosilicate as a material over a large insulating substrate; and opposing the third insulating film and a region of the rectangular column polycrystalline semiconductor ingot, which is to be a polycrystalline layer; while heating, separating the polycrystalline layer from the hydrogen ion irradiation region; and attaching the polycrystalline layer to the large insulating substrate.

Further, the present invention relates to a method for manufacturing a semiconductor device, including the steps of anodizing a side surface of a single crystal semiconductor ingot, thereby forming a first porous layer; forming a second porous layer over the first porous layer by changing a condition of the anodization; forming a groove in an upper part of the second porous layer, forming an epitaxially grown single crystal semiconductor layer in a region over the second porous layer other than the groove; forming a first insulating film, a second insulating film, a third insulating film using a silicon oxide film using tetraethylorthosilicate as a material over a large insulating substrate; attaching the groove over the single crystal semiconductor ingot onto the third insulating film over the large insulating substrate; directing water jet to an interface between the first porous layer and the second porous layer; while rolling the single crystal semiconductor ingot, separating the single crystal semiconductor layer and the second porous layer from the single crystal semiconductor ingot; and attaching the single crystal semiconductor layer to the third insulating film; forming the first insulating film, the second insulating film, the third insulating film, the single crystal semiconductor layer, and the second porous layer over the large insulating substrate; removing the second porous layer; etching the single crystal semiconductor layer, thereby forming a semiconductor island region; forming a gate insulating film over the semiconductor island region; forming a gate electrode over the gate insulating film; and adding an impurity element imparting one conductivity to the semiconductor island region using the gate electrode as a mask, thereby forming a source region, a drain region, and a channel formation region in the semiconductor island region.

In the present invention, the single crystal semiconductor ingot is a single crystal silicon ingot, and the single crystal semiconductor layer is a single crystal silicon layer.

Further, the present invention relates to a method for manufacturing a semiconductor device, including the steps of irradiating a side surface of a crystalline semiconductor ingot with hydrogen ions in the direction perpendicular to the central axis while rolling the single crystal semiconductor ingot, thereby forming a hydrogen ion irradiation region in a tubular shape; moving the crystalline semiconductor ingot in the direction perpendicular to the central axis of the crystalline semiconductor ingot; separating a crystalline semiconductor layer from the hydrogen ion irradiation region; attaching the crystalline semiconductor layer onto a large insulating substrate; etching the crystalline semiconductor layer, thereby forming a semiconductor island region; forming a gate insulating film over the semiconductor island region; forming a gate electrode over the gate insulating film; and adding an impurity element imparting one conductivity to the semiconductor island region using the gate electrode as a mask, thereby forming a source region, a drain region, and a channel formation region in the semiconductor island region.

In the present invention, the crystalline semiconductor ingot is rolled along the circumference while being heated.

Further, the present invention relates to a method for manufacturing a semiconductor device, including the steps of while rolling a circle columnar crystalline semiconductor ingot, irradiating the circle columnar crystalline semiconductor ingot with hydrogen ions, thereby forming a hydrogen ion irradiation region in a tubular shape; contacting and attaching an outer region of the hydrogen ion irradiation region to a large insulating substrate, so that the large insulating substrate wraps the hydrogen ion irradiation region of the crystalline semiconductor ingot; while heating the large insulating substrate and the crystalline semiconductor ingot, separating a crystalline semiconductor layer which is the outer region of the hydrogen ion irradiation region from the hydrogen ion irradiation region, and attaching the crystalline semiconductor layer to the large insulating substrate; etching the crystalline semiconductor layer, thereby forming a semiconductor island region; forming a gate insulating film over the semiconductor island region; forming a gate electrode over the gate insulating film; and adding an impurity element imparting one conductivity to the semiconductor island region using the gate electrode as a mask, thereby forming a source region, a drain region, and a channel formation region in the semiconductor island region.

In the present invention, a first insulating film, a second insulating film, and a third insulating film using a silicon oxide film using tetraethylorthosilicate as a material are formed over the large insulating substrate.

In the present invention, the crystalline semiconductor ingot is a crystalline silicon ingot, and the crystalline semiconductor layer is a crystalline silicon layer.

In the present invention, the crystalline semiconductor ingot is a single crystal semiconductor ingot or a polycrystalline semiconductor ingot, and the crystalline semiconductor layer is a single crystal semiconductor layer or a polycrystalline layer.

Further, the present invention relates to a method for manufacturing a semiconductor device, including the steps of irradiating a rectangular column polycrystalline semiconductor ingot with hydrogen ions, thereby forming a hydrogen ion irradiation region in the rectangular column polycrystalline semiconductor ingot; forming a first insulating film, a second insulating film, and a third insulating film using a silicon oxide film using tetraethyl orthosilicate as a material over a large insulating substrate; opposing the third insulating film and a region of the rectangular column polycrystalline semiconductor ingot, which is to be a polycrystalline layer, while heating, separating the polycrystalline layer from the hydrogen ion irradiation region, and attaching the polycrystalline layer to the large insulating substrate; etching the polycrystalline semiconductor layer, thereby forming a semiconductor island region; forming a gate insulating film over the semiconductor island region; forming a gate electrode over the gate insulating film; and adding an impurity element imparting one conductivity to the semiconductor island region using the gate electrode as a mask, thereby forming a source region, a drain region, and a channel formation region in the semiconductor island region.

In the present invention, the rectangular column polycrystalline semiconductor ingot is a rectangular column polycrystalline silicon ingot, and the polycrystalline layer is a polycrystalline silicon layer.

In the present invention, the first insulating film is formed using a silicon nitride film containing oxygen, and the second insulating film is formed using a silicon nitride film containing nitrogen.

Note that in the present invention, a thermal oxide film (silicon oxide film) obtained by thermally oxidizing a silicon film may be used as the third insulating film instead of the silicon oxide film using tetraethyl orthosilicate as a material.

BRIEF DESCRIPTION OF THE DRAWINGS

FIGS. 10A and 11B illustrate steps of forming a crystalline semiconductor layer of the present invention;

DETAILED DESCRIPTION OF THE INVENTION

Embodiment Modes

Figure 1A:
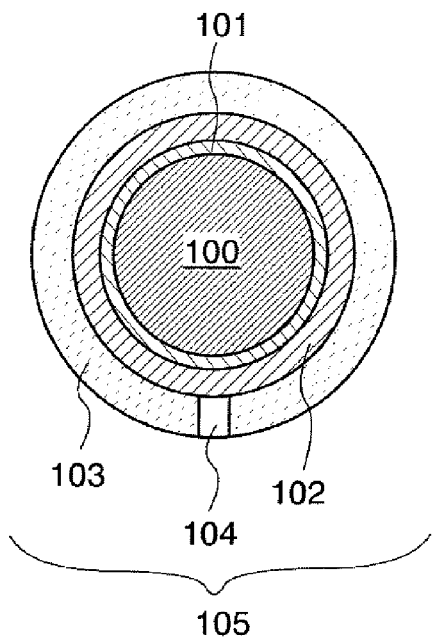
FIGS. 1A to 1C each illustrate a step of forming a crystalline semiconductor layer of the present invention.

Embodiment modes and embodiments of the present invention will be explained with reference to the drawings. However, the present invention is not limited to the following description. As is readily appreciated by those skilled in the art, the mode and the detail of the present invention can be changed in various ways without departing from the spirit and the scope of the present invention. Therefore, the present invention should not be construed as being limited to the description of the embodiment modes to be given below. Note that in the drawings for illustrating the structures of the invention, like portions are denoted by the same reference numerals throughout the drawings.

Note that in this specification, "semiconductor device" refer to general devices which can function by utilizing semiconductor properties, and display devices using liquid crystal, electroluminescence (EL), or the like, semiconductor circuits, and electronic devices are all defined as semiconductor devices.

Embodiment Mode 1

This embodiment mode will be described with reference to FIGS. 1A to 1C, FIGS. 2A to 2D, and FIGS. 7A to 7E.

In this embodiment mode, an example in which a silicon ingot is used as a single crystal semiconductor ingot, and as a single crystal semiconductor layer having large area, a single crystal silicon layer is separated from the silicon ingot and bonded to a large insulating substrate, for example, a large glass substrate, will be described.

First, anodization is performed on the entire side surface of a silicon ingot 100, and a first porous silicon layer 101 and a second porous silicon layer 102 are formed as a first porous layer and a second porous layer, respectively. In this embodiment mode, the silicon ingot 100 used has a diameter of 30 cm and a length of 100 cm or more.

Note that in the present invention, a semiconductor is not limited to silicon, and another semiconductor, for example, germanium, silicon germanium, or the like, and an oxide semiconductor or the like may be used if possible. A single crystal semiconductor layer having large area may be formed using such a semiconductor ingot. Further, the porous layer becomes a porous layer which corresponds to the used semiconductor.

Figure 1B:
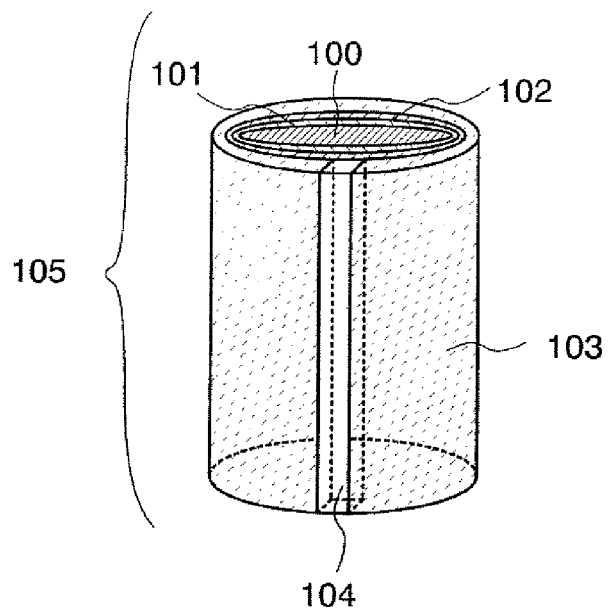
Figure 1C:
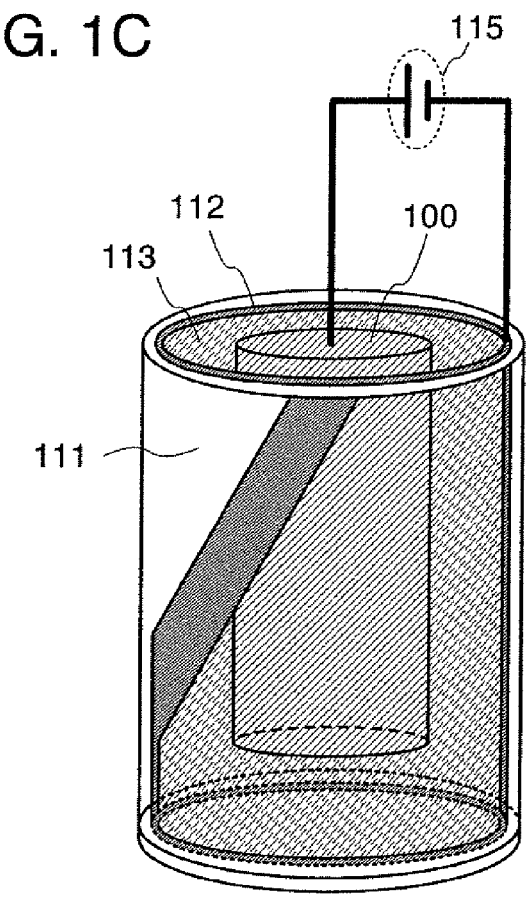

As shown in FIG. 1C, a receptacle 111 is filled with a mixed solution 113 of hydrofluoric acid ethanol, and the silicon ingot 100 is provided therein. The silicon ingot 100 and an electrode 112 provided in the receptacle 111 are connected to a current source 115 as an anode and a cathode, respectively for application of current. Platinum (Pt) or the like may be used for the electrode 112.

Upon applying current, a porous silicon layer having pores with a diameter of several nm, which are spaced several tens nm, is formed over a surface of the silicon ingot 100.

When forming a porous silicon layer, formation conditions such as current density is changed so that the first porous silicon layer 101 and the second porous silicon layer 102 can be formed.

Strain is localized at the interface between the first porous silicon layer 101 and the second porous silicon layer 102. The larger the size of the pores of the second porous silicon layer 102 is, the larger the strains get.

After that, heating is performed at approximately 1000° C. to 1100° C. in a hydrogen atmosphere. The heating step seals pores formed at the surfaces of the first porous silicon layer 101 and the second porous silicon layer 102, and the surfaces are planarized.

Next, a silicon epitaxial layer 103 (single crystal silicon layer) is grown over a second porous silicon layer 102 by CVD or the like. At this time, a groove 104 may be formed in the side surface of the second porous silicon layer 102. Even if the groove 104 is not formed, the first porous silicon layer 101 and the second porous silicon layer 102 can be separated by using water jet 130 during the following steps.

In the case of forming the groove 104, when the epitaxial layer 103 is grown, a mask may be formed over a part of the second porous silicon layer 102 to form the groove 104 without epitaxial growth.

Further, in the case of forming the groove 104, after the epitaxial layer 103 is formed over an entire surface of the second porous silicon layer 102, the groove 104 may be formed by removing a part of the epitaxial layer 103 using a dicer such as a laser or a blade.

As described above, the first porous silicon layer 101, the second porous silicon layer 102, the silicon epitaxial layer 103, and the groove 104 are formed over the silicon ingot 100, and they are collectively defined as an ingot 105. FIG. 1A is a cross-sectional view of the ingot 105, and FIG. 1B is a perspective view of the ingot 105.

Further, in this embodiment mode, a glass substrate is used as a large insulating substrate 120, and a first insulating film 121, a second insulating film 122, and a third insulating film 123 are formed over the large insulating substrate 120. In this embodiment mode, a silicon nitride film containing oxygen and a silicon oxide film containing nitrogen are formed by plasma CVD, as the first insulating film 121 and the second insulating film 122, respectively. Further, as the third insulating film 123, a silicon oxide film is formed by plasma CVD using TEOS (tetraethyl orthosilicate) as a material, to have a thickness of 50 nm to 100 nm. Further, as the third insulating film 123, a thermal oxide film (silicon oxide film) obtained by forming a silicon film first, and thermally oxidizing it may be used. Further, the large insulating substrate 120, the first insulating film 121, the second insulating film 122, and the third insulating film 123 are collectively referred to as a substrate 124 (see FIG. 2A).

As the large insulating substrate 120, a glass substrate of aluminosilicate glass, alumino-borosilicate glass, barium borosilicate glass, or the like, or a semiconductor substrate of quartz glass other than glass substrates, besides, a plastic substrate or the like can be used.

Next, the groove 104 of the ingot 105 is attached to the substrate 124. In the case where the groove 104 is not formed, a part of the epitaxial layer 103 is made to be in contact with the substrate 124.

Further, the water jet 130 is directed to part of the interface between the first porous silicon layer 101 and the second porous silicon layer 102, where strains are large; thus, the first porous silicon layer 101 and the second porous silicon layer 102 are separated.

Figure 2A:
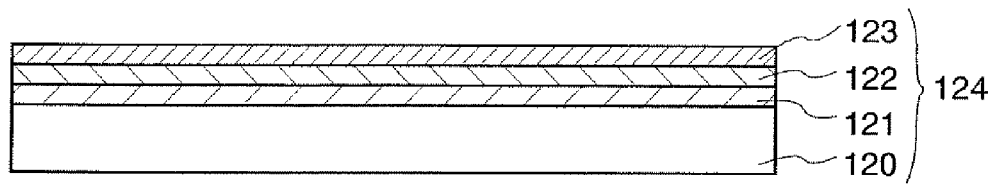
FIGS. 2A to 2D illustrate steps of forming a crystalline semiconductor layer of the present invention.
Figure 2B:
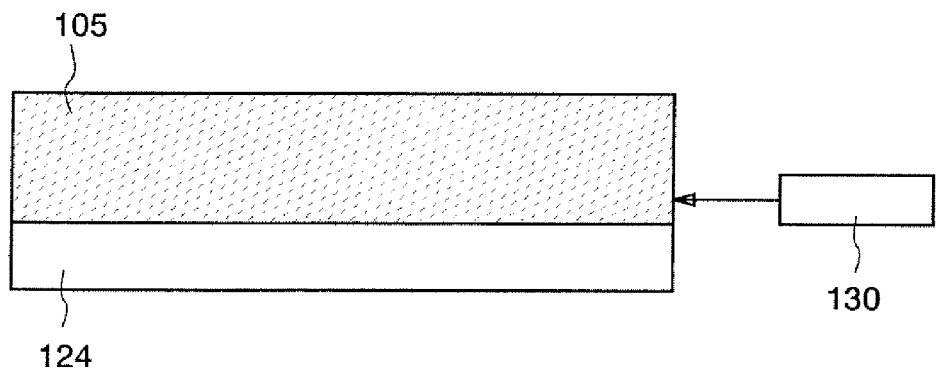
Figure 2C:
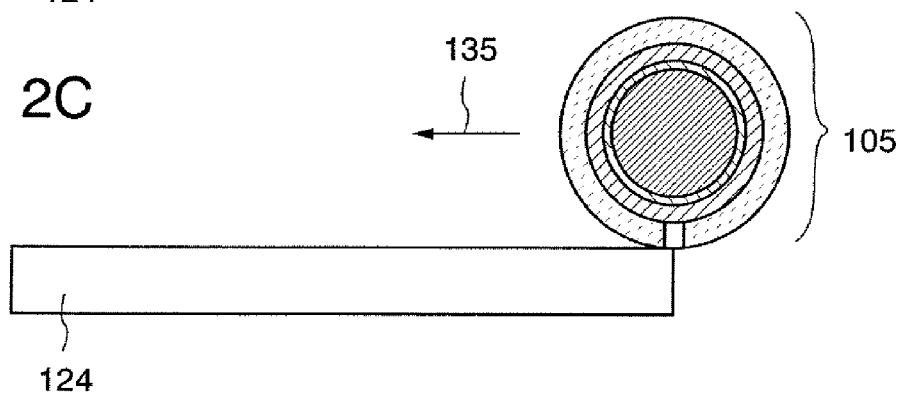

FIG. 2B is a cross-sectional view of the substrate 124 and the ingot 105, which are viewed from the side surface of the ingot 105, FIG. 2C is a cross-sectional view of the substrate 124 and the ingot 105, which are viewed from a cross section of the ingot 105.

As shown in FIG. 2B, the water jet 130 is directed to a cross section of the ingot 105. Further, although not shown in FIG. 2C, the water jet 130 is directed in the direction from the surface of the paper to the back surface.

Figure 2D:
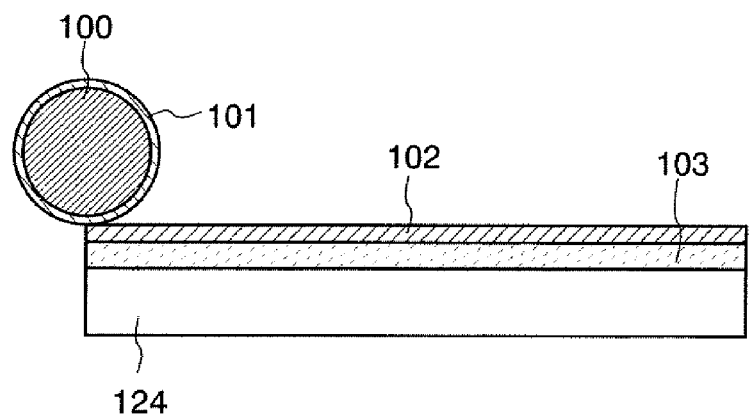

The ingot 105 is rolled in the direction perpendicular to the central axis of the ingot 105 over the substrate 124, and is made to travel in the direction indicated by the arrow 135, using the groove 104 as a start; thus, the silicon epitaxial layer 103 and the second porous silicon layer 102 are separated (see FIG. 2D).

In this embodiment mode, a silicon ingot having a diameter of 30 cm and a length of 100 cm or more is used as the silicon ingot 100; therefore, the silicon epitaxial layer 103 having a size of 94.2 cm×100 cm or more can be formed over the substrate 124.

Figure 7A:
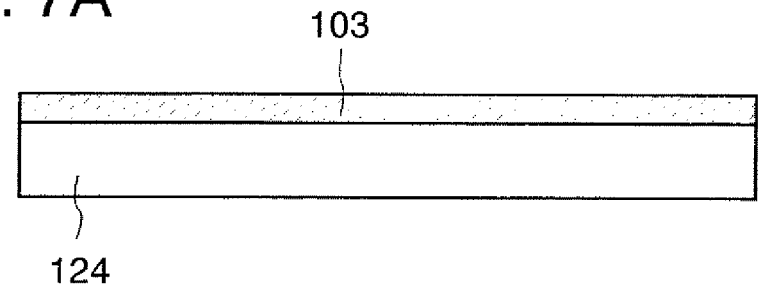
FIGS. 7A to 7E illustrate steps of forming a crystalline semiconductor layer of the present invention.
Figure 7B:
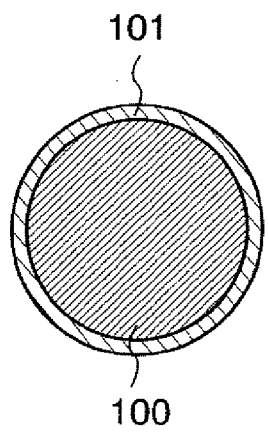

Then, the second porous silicon layer 102 is removed from the second porous silicon layer 102 and the silicon epitaxial layer 103 over the substrate 124 by selective etching (see FIG. 7A). Since porous silicon has significantly large surface area (for example, approximately 100 $m^2/cm^3$); thus, the etching rate is high. Accordingly, only the second porous silicon layer 102 is selectively etched, and only the silicon epitaxial layer 103 remains on the substrate 124.

Further, after the etching, transfer of surface silicon atoms is promoted by a hydrogen annealing method to planarize the silicon epitaxial layer 103 at the atom level.

In the manner described above, the silicon epitaxial layer 103 can be formed over the entire surface of the substrate 124 having large area.

Figure 7C:
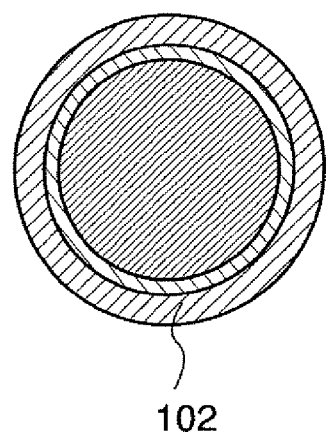
Figure 7D:
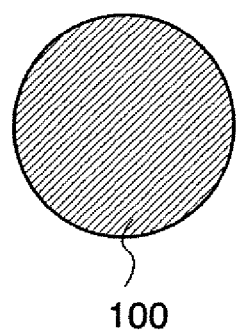

Further, the silicon ingot 100 form which the second porous silicon layer 102 and the silicon epitaxial layer 103 are separated, and the first porous silicon layer 101 (see FIG. 7B) can be reused through the same steps from forming the second porous silicon layer 102 (see FIG. 7C).

Figure 7E:
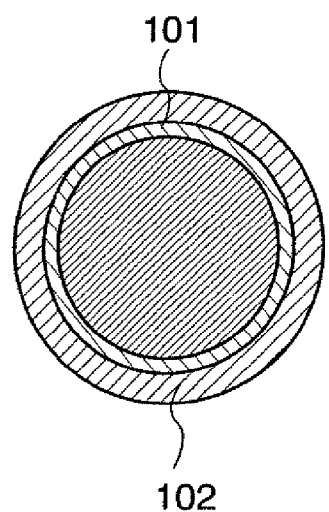
Figure 8A:
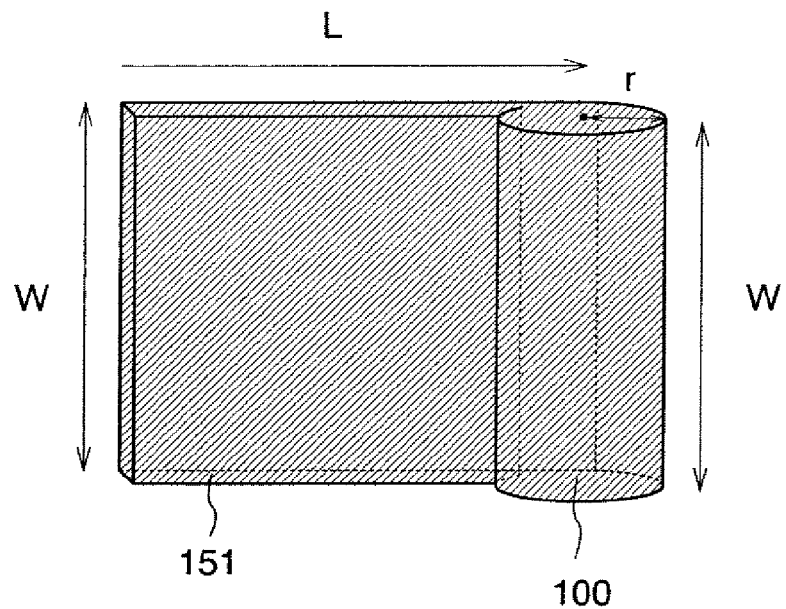
FIGS. 8A to 8C illustrate steps of forming a crystalline semiconductor layer of the present invention.
Figure 8B:
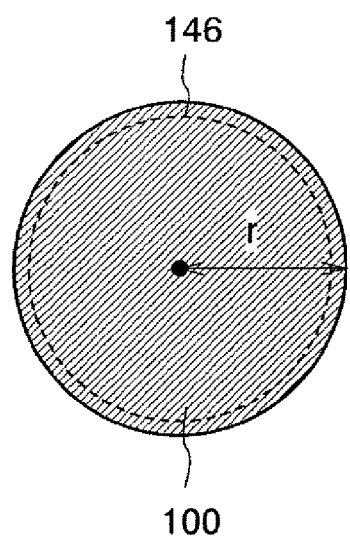
Figure 8C:
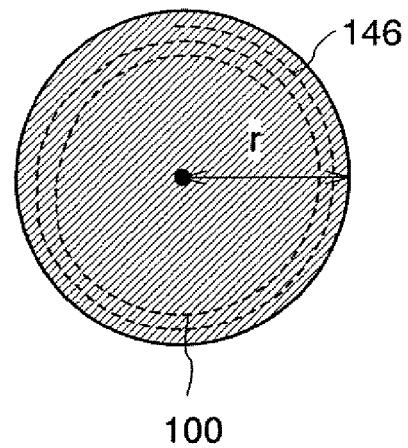

Alternatively, the remaining first porous silicon layer 101 is once removed from the silicon ingot 100 (see FIG. 7D), and the first porous silicon layer 101 and the second porous silicon layer 102 may be newly formed (see FIG. 7E).

Further, in the case where the diameter of the silicon ingot 100 is smaller, it can be used as a silicon wafer.

In accordance with this embodiment mode, a single crystal silicon layer having large area can be formed over an insulating substrate having large area. Moreover, a silicon ingot which is a material for forming a single crystal silicon layer can be reused, and single crystal silicon layers having large area can be mass-produced.

Embodiment Mode 2

In this embodiment mode, a method for obtaining a single crystal silicon layer having large area, which is different from that in Embodiment Mode 1, a method for obtaining a single crystal silicon layer, a method for manufacturing a semiconductor device using the single crystal silicon layer will be described with reference to FIGS. 3A to 3B, FIGS. 4A to 4D, and FIGS. 8A to 8C.

Further, in this embodiment mode, an example in which a silicon ingot is used as a single crystal semiconductor ingot, and as a single crystal semiconductor layer having large area, a single crystal silicon layer is separated from the silicon ingot and bonded to a large insulating substrate, for example, a large glass substrate, as in Embodiment Mode 1 will be described.

First, based on Embodiment Mode 1, the substrate 124 in which the first insulating film 121, the second insulating film 122, and the third insulating film 123 are formed over the large insulating substrate 120 is prepared.

In this embodiment mode, a glass substrate of 680 mm×880 mm or 730 mm×920 mm is used as the large insulating substrate 120.

On the other hand, for example, a silicon ingot having a diameter of 300 mm (circumference is approximately 942 mm) and a length of 1000 mm is used as the silicon ingot 100.

Figure 3A:
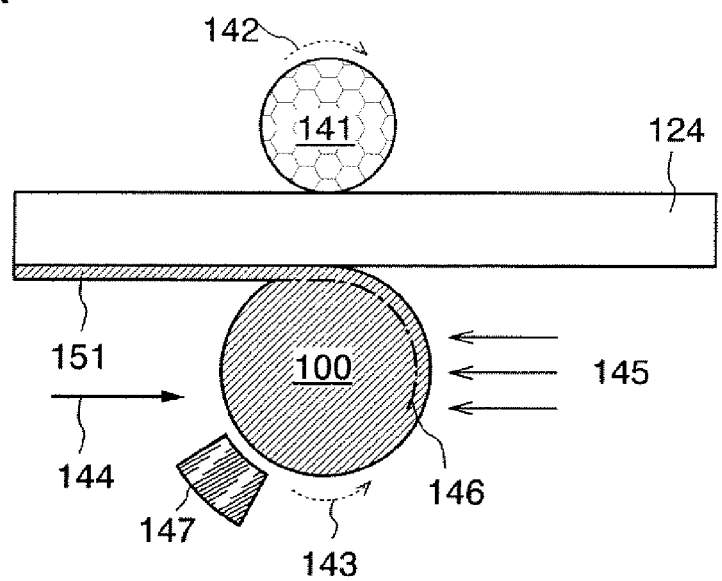
FIGS. 3A and 3B illustrate a step of forming a crystalline semiconductor layer of the present invention.
Figure 3B:
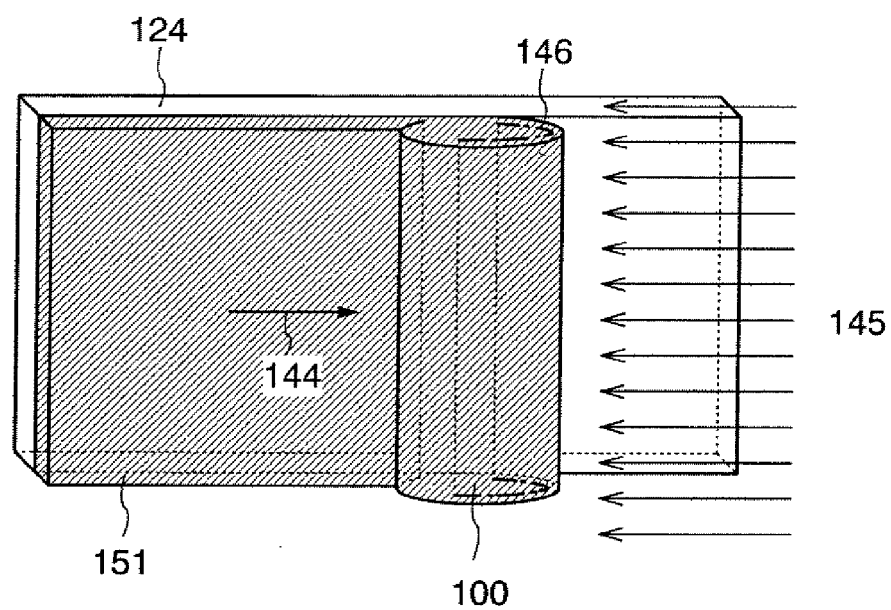

The silicon ingot 100 is placed over the substrate 124, and a crimping roller 141 is formed over a surface of the substrate 124, which is not provided with the silicon ingot 100. The crimping roller 141 and the silicon ingot 100 are rolled in the direction of in dotted-line arrows 142 and 143, respectively (see FIG. 3A). Note that FIG. 3A is a cross-sectional view of the silicon ingot 100 viewed from the cross-sectional direction, and FIG. 3B is a perspective view from the surface side of the substrate 124, over which the silicon ingot 100 is placed.

The surface of the silicon ingot 100 is provided with a planarization apparatus 147 for planarizing the surface of the silicon ingot 100.

Hydrogen ions are applied from the surface of the silicon ingot 100 in the direction perpendicular to the central axis of the silicon ingot 100. Specifically, the silicon ingot 100 is subjected to ion doping or ion implantation with hydrogen ions 145. Thus, the hydrogen ion irradiation region 146 is formed with a spiral shape inside the silicon ingot 100.

After the silicon ingot 100 is placed over the substrate 124, while heating the silicon ingot 100, the silicon ingot 100 is rolled along the dotted-line arrow 143 along the circumference, and is moved in the direction perpendicular to the central axis of the silicon ingot 100, which is indicated by the solid-line arrow 144. Thus, the hydrogen ion irradiation region 146 is separated from a single crystal silicon layer 151 and is bonded to the substrate 124.

Figure 4A:
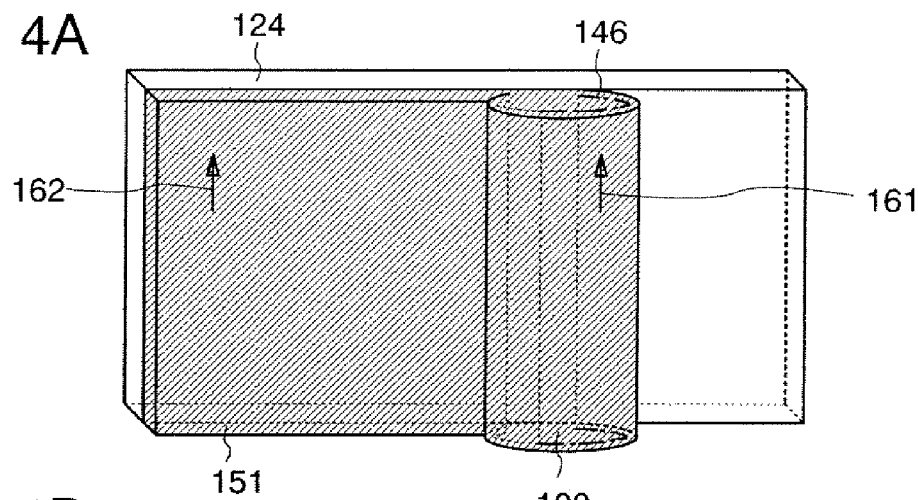
FIGS. 4A to 4D illustrate steps of forming a crystalline semiconductor layer of the present invention.
Figure 4B:
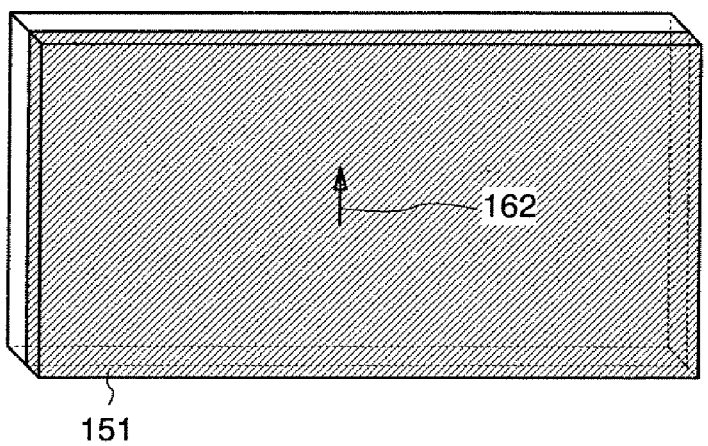

A crystal orientation 161 which is perpendicular to the radial direction of the silicon ingot 100 (direction of the central axis) and a crystal orientation 162 of the single crystal silicon layer 151 formed over the substrate 124 agree with each other (see FIG. 4A). Further, the crystal orientation 162 of the single crystal silicon layer 151 is perpendicular to the moving direction of the silicon ingot 100 (solid-line arrow 144) and also perpendicular to the direction normal to the substrate 124.

Figure 4C:
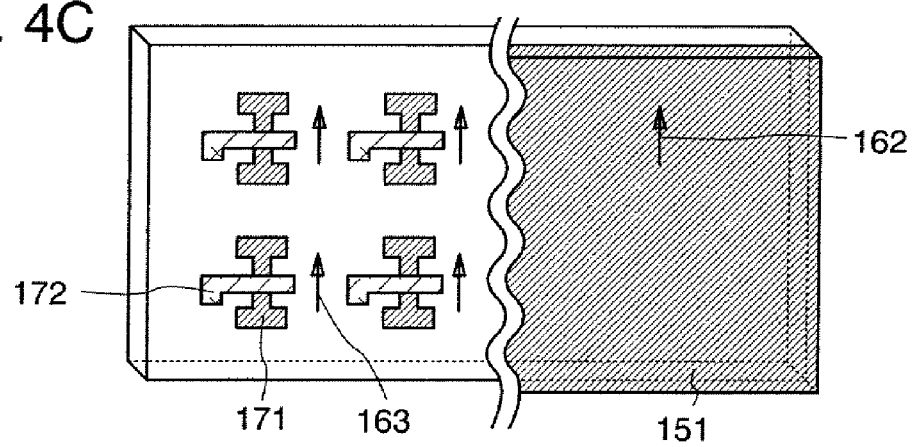
Figure 4D:
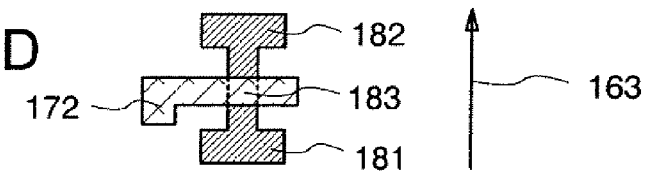

Therefore, in the case of forming a semiconductor device using the single crystal silicon layer 151, for example, a transistor after the single crystal silicon layer 151 is formed over the entire surface of the substrate 124 (see FIG. 4B), a semiconductor device with reduced variation can be manufactured by designing circuits so that the direction in which carriers of the transistor flow, which is indicated by an arrow 163 agrees with the crystal orientation 162 of the single crystal silicon layer 151 (see FIG. 4C and FIG. 4D).

Note that transistors shown in FIG. 4C and FIG. 4D have an active layer 171 and a gate electrode 172 which are formed from the single crystal silicon layer 151. Further, in the active layer 171, a region 181 that is one of a source region and a drain region, a region 182 that is the other of the source region and the drain region, and a channel formation region 183 that is interposed between the region 181 and the region 182 and overlaps with the gate electrode 172 with a gate insulating film therebetween.

Figure 5A:
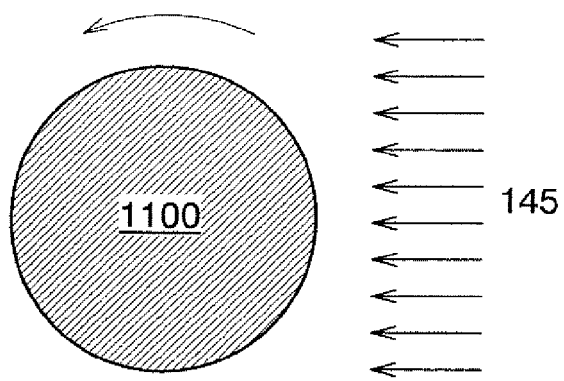
FIGS. 5A to 5D illustrate steps of forming a crystalline semiconductor layer of the present invention.

As shown in FIG. 5A, the radius of the silicon ingot 100 is r, the length of the silicon ingot 100 is W, and the length of the single crystal silicon layer 151 is L. Hydrogen ions are injected to the side surface of the silicon ingot 100 to form a hydrogen ion irradiation region 146, and then the silicon ingot 100 is bonded to the substrate 124; thus, the maximum value of L becomes $2\pi r$. Further, the area of the single crystal silicon layer 151 becomes $W \times (2\pi r)$ (see FIG. 8B). Note that, as described in Embodiment Mode 1, the silicon ingot 109 from which the single crystal silicon layer 151 is once separated can be reused, so that a new single crystal silicon layer having large area can be formed.

On the other hand, as described in this embodiment mode, the formation of the hydrogen ion irradiation region 146 and the bonding is simultaneously performed by hydrogen ion implantation, the length L of the single crystal silicon layer 151 can be a chosen length longer than $2\pi r$. Until the silicon ingot 100 is exhausted, the single crystal silicon layer having large area can be separated repeatedly.

Note that a polycrystalline silicon ingot may be used instead of the silicon ingot 100 of a single crystal, and a polycrystalline silicon layer may be separated instead of the single crystal silicon layer 151. Accordingly, in accordance with this embodiment mode, a crystalline silicon layer which is a single crystal silicon layer or a polycrystalline silicon layer can be separated from a crystalline silicon ingot which is a single crystal silicon ingot or a polycrystalline silicon ingot.

In this embodiment mode, a semiconductor is not limited to silicon, as in Embodiment Mode 1, and another semiconductor, for example, germanium, silicon germanium, or the like, and an oxide semiconductor or the like may be used if possible. Thus, in accordance with this embodiment mode, a crystalline semiconductor layer can be separated from a crystalline semiconductor ingot.

Embodiment Mode 3

In this embodiment mode, a method of obtaining a crystalline silicon layer having large area, which is different from the methods in Embodiment Mode 1 and Embodiment Mode 2 will be described with reference to FIGS. 5A to 5D and FIGS. 6A to 6B.

Figure 5B:
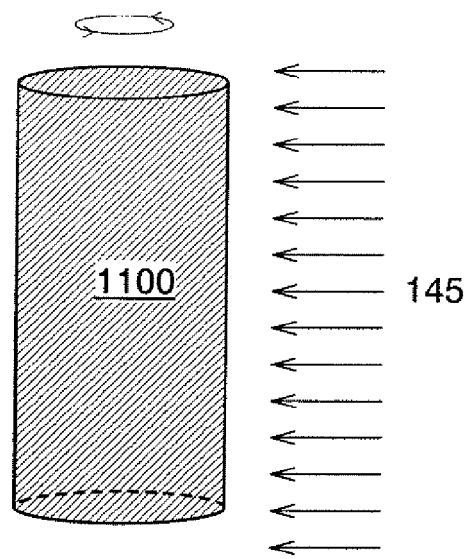

First, while rolling a circle columnar crystalline silicon ingot 1100, the hydrogen ions 145 are applied (see FIGS. 5A and 5B). Note that FIG. 5A is a cross-sectional view viewed from the cross-sectional direction of the crystalline silicon ingot 1100 and FIG. 5B is a perspective view viewed from the side surface direction of the crystalline silicon ingot 1100.

In this embodiment mode, a crystalline silicon ingot having a diameter of 880 mm and a length of 300 mm is used as the crystalline silicon ingot 1100. As the crystalline silicon ingot 1100, either a single crystal silicon ingot or a polycrystalline silicon ingot can be used.

Hydrogen ions 145 are injected to the crystalline silicon ingot 1100, so that the hydrogen ion irradiation region 146 is formed to have a circular shape, more specifically, concentrically with the top face of the crystalline silicon ingot inside the crystalline silicon ingot 1100. Further, the region outside the hydrogen ion irradiation region 146 is to be separated in a later step to be a crystalline silicon layer 1151. The crystalline silicon layer 1151 is a single crystal silicon layer if the crystalline silicon ingot 1100 is a single crystal silicon ingot, and is a polycrystalline silicon layer if the crystalline silicon ingot 1100 is a polycrystalline silicon ingot.

Figure 5C:
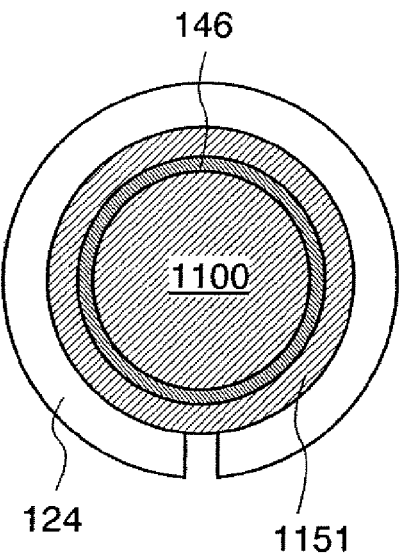
Figure 5D:
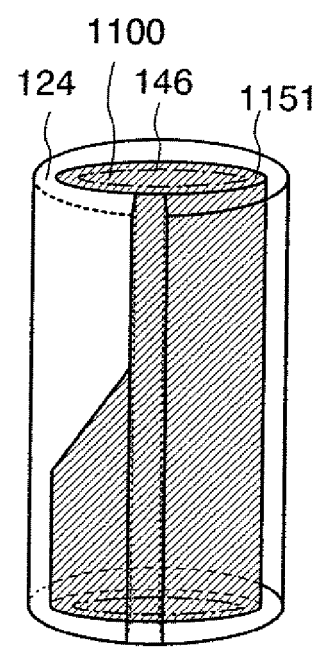

Next, the substrate 124 is bonded so as to wrap a region to be the crystalline silicon layer 1151 (see FIGS. 5C and 5D). Note that FIG. 5C is a cross-sectional view viewed from a cross-sectional direction of the crystalline silicon ingot 1100, and FIG. 5D is a perspective view viewed from the side surface direction of the crystalline silicon ingot 1100.

The substrate 124 is the same as the substrate 124 in Embodiment Mode 1, and it has the large insulating substrate 120, the first insulating film 121, the second insulating film 122, and the third insulating film 123. The third insulating film 123 and a region to be the crystalline silicon layer 1151 are made to be in contact with each other.

A relatively easily bendable thin glass substrate may be used for the large insulating substrate 120.

Figure 6A:
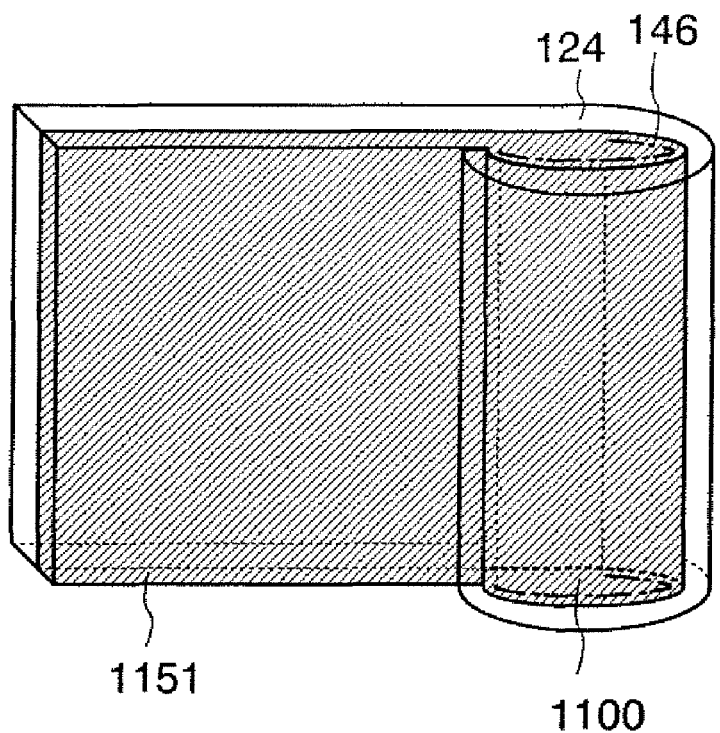
FIGS. 6A and 6B each illustrate a step of forming a crystalline semiconductor layer of the present invention.
Figure 6B:
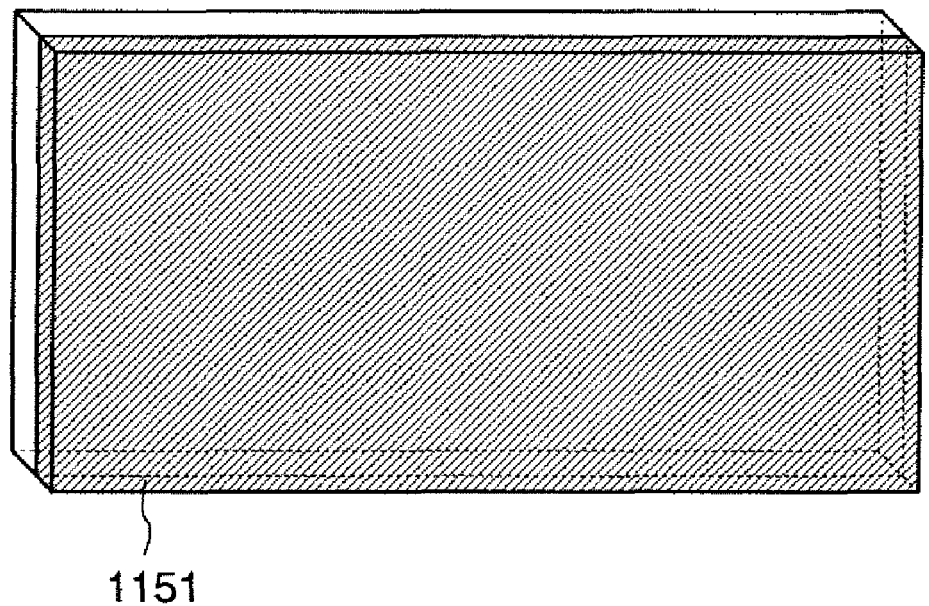

Next, while heating the substrate 124 and the crystalline silicon ingot 1100, the crystalline silicon layer 1151 is separated from the hydrogen ion irradiation region 146 and bonded to the substrate 124 (see FIG. 6A).

Through the above steps, the crystalline silicon layer 1151 is formed over the entire surface of the substrate 124. In this embodiment mode, a crystalline silicon ingot having a diameter of 880 mm and a length of 300 mm is used for the crystalline silicon ingot 1100, so that the crystalline silicon layer 1151 having an area of up to $(880\pi) \times 300$ mm$^2$ can be obtained.

Note that in this embodiment mode, as in FIG. 5B, when the radius of the crystalline silicon ingot 1100 is r, the length of the crystalline silicon ingot 1100 is W, and the length of the crystalline silicon layer 1151 is L, the area of the crystalline silicon layer 1151 is up to W×(2%).

Note that as in Embodiment Mode 1, the crystalline silicon ingot 1100 from which the crystalline silicon layer 1151 is once separated can be reused, so that a new crystalline silicon layer having large area can be formed.

Embodiment Mode 4

In this embodiment mode, a method of forming a crystalline silicon layer having large area, which is different from the methods in Embodiment Mode 1 to Embodiment Mode 3 will be described with reference to FIGS. 9A to 9E, FIGS. 10A to 10D, and FIGS. 11A to 11B.

Figure 9A:
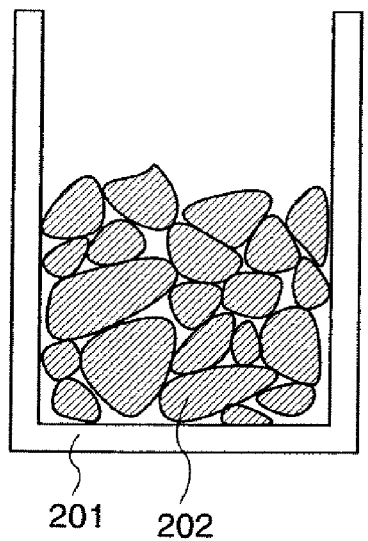
FIGS. 9A to 9E illustrate steps of forming a crystalline semiconductor layer of the present invention.
Figure 9B:
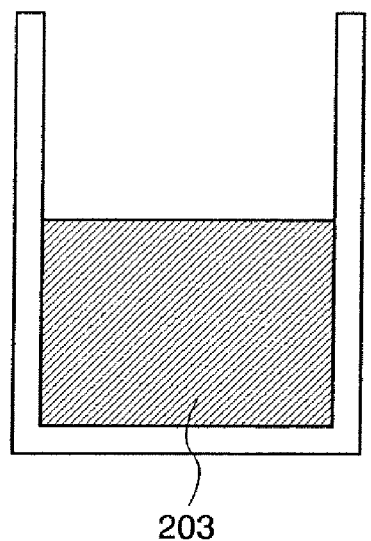

A material 202 is put in a crucible 201 (see FIG. 9A), and heating is performed to melt the silicon material 202, thus, a liquid melt 203 is obtained (see FIG. 9B). After that, the liquid melt 203 is cooled, and crystal growth is started from the bottom of the crucible 201 to the top, so that a silicon ingot in which crystal grows in the direction indicated by an arrow 211 is formed (see FIG. 9C). In the case where the crucible 201 has a rectangular column shape, a rectangular column ingot 205 is formed (see FIG. 9D), and in the case where the crucible 201 has a circular cylindrical shape, a circular cylindrical silicon ingot 206 is formed (see FIG. 9E).

Note that in the case where a semiconductor, other than silicon, for example, germanium, silicon germanium, or the like and an oxide semiconductor or the like is used as a semiconductor, the materials are the material 202.

Figure 9C:
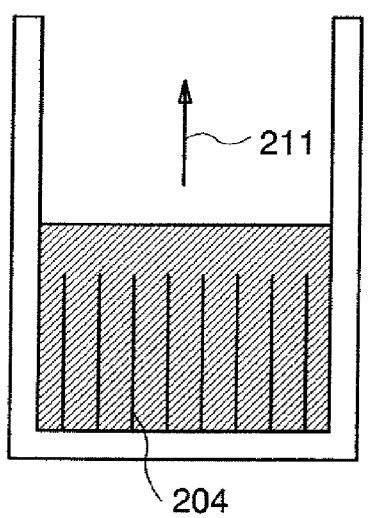
Figure 9D:
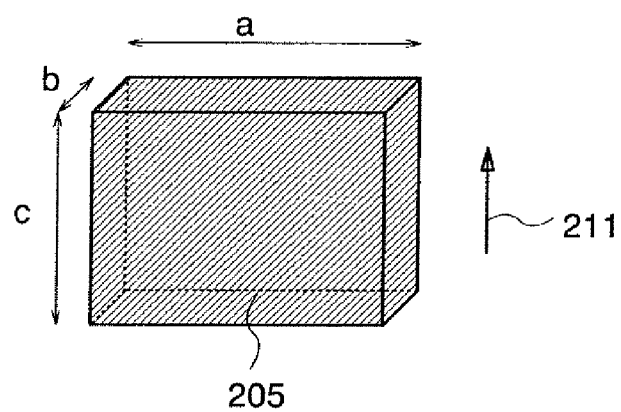
Figure 9E:
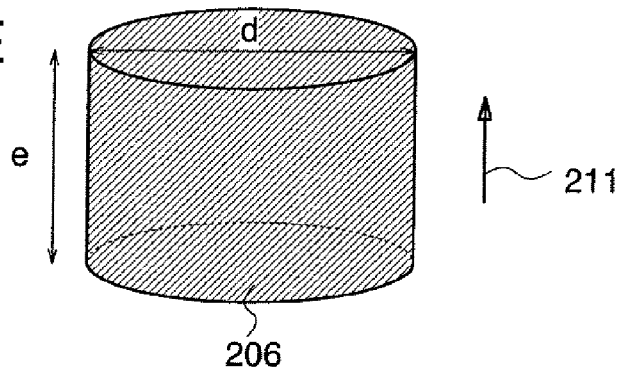

Note that when the liquid melt 203 is cooled and crystal growth is started from the bottom of the crucible 201 toward the top, partitions 204 are disposed in the crystal growth direction indicated by the arrow 211 in the crucible 201 (see FIG. 9C). When the liquid melt 203 is cooled, seed crystal is generated at the lowest part of the crucible 201, and crystal growth proceeds from the seed crystal along the partitions 204; thus, a polycrystalline silicon ingot is formed.

Of polycrystalline silicon ingots formed in this manner, the rectangular column ingot 205 has a longitudinal length of b, a lateral length of a, and a height of c, and the circular cylindrical silicon ingot 206 has a diameter of d and a height of e.

A method of forming a polycrystalline silicon layer having large area using the rectangular column ingot 205 will be described with reference to FIGS. 10A to 10D.

Figure 10A:
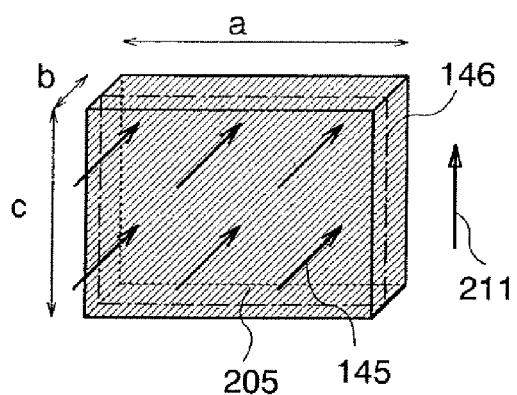
FIGS. 10A to 10D illustrate steps of forming a crystalline semiconductor layer of the present invention.

As shown in FIG. 10A, perpendicularly to the arrow 211 indicating the crystal growth direction, that is, in the direction from the paper surface to the back surface, hydrogen ions 145 are injected, and the hydrogen ion irradiation region 146 is formed inside the rectangular column ingot 205.

Figure 10B:
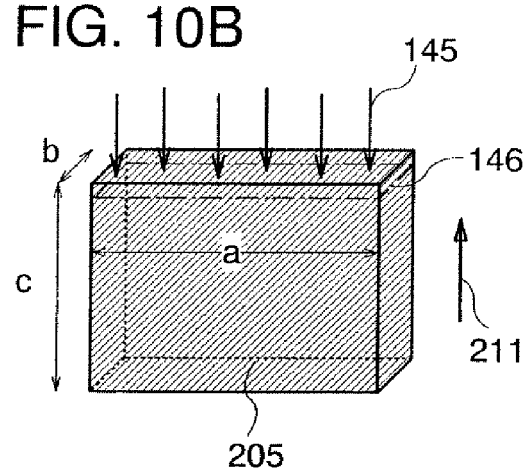
Figure 10C:
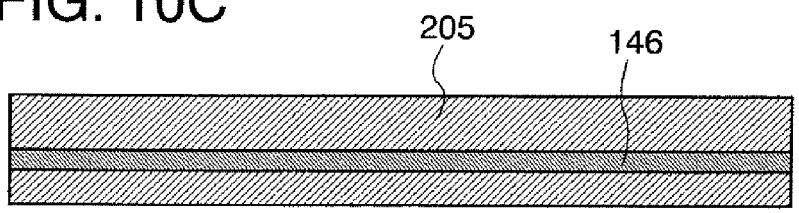
Figure 10C:
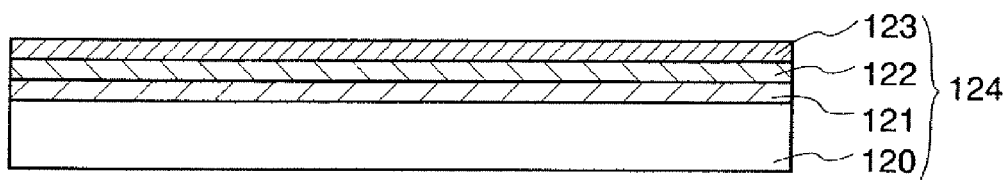

As in FIG. 2A, the substrate 124 in which the first insulating film 121, the second insulating film 122, and the third insulating film 123 are formed over the large insulating substrate 120 is opposed to the rectangular column ingot 205 in which the hydrogen ion irradiation region 146 is formed (see FIG. 10C).

Figure 10D:
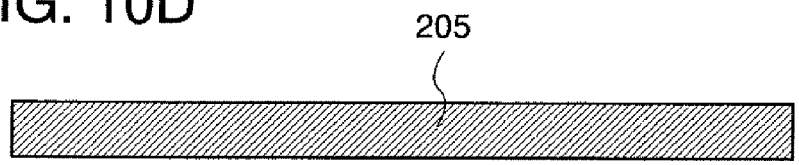
Figure 10D:
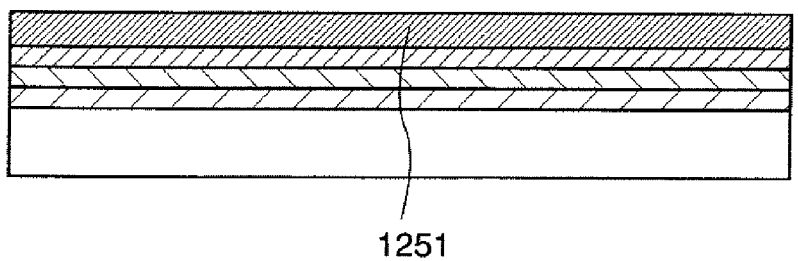

Next, the polycrystalline silicon layer 1251 is separated from the hydrogen ion irradiation region 146 by heating, and is bonded to the substrate 124 (see FIG. 10D). The rectangular column ingot 205 is reused to be irradiated with hydrogen ions and a polycrystalline silicon layer will be separated.

For example, assuming that the rectangular column ingot 205 having a longitudinal length b of 880 mm, a lateral length a of 880 mm, and a height c of 205 mm is obtained, when it is cut along the arrow 211 indicating the crystal growth direction, the polycrystalline silicon layer 1251 of up to 880 mm×205 mm can be obtained.

Further, using the polycrystalline silicon layer 1251, a semiconductor device can be manufactured so that the crystal growth direction of the polycrystalline silicon layer 1251 and the carrier transfer direction in an active layer of the semiconductor device, for example, a transistor agree with each other.

Further, as shown in FIG. 10B, hydrogen ions 145 are injected along the arrow 211 indicating the crystal growth direction to form the hydrogen ion irradiation region 146 in the rectangular column ingot 205.

The third insulating film 123 and a region to be the polycrystalline silicon layer 1251 are opposed and heated, and the polycrystalline silicon layer 1251 is separated from the hydrogen ion irradiation region 146 in the direction perpendicular to the arrow 211 indicating the crystal growth direction, and the polycrystalline silicon layer 1251 is bonded to the substrate 124 (see FIGS. 10C and 10D).

In this case, the polycrystalline silicon layer 1251 having an area of a longitudinal length b×lateral length a can be obtained. For example, in the case where the longitudinal length b is 880 mm, the lateral length a is 880 mm, and the height c is 205 mm, the polycrystalline silicon layer 1251 of up to 880 mm×880 mm can be obtained.

Further, in the case where the rectangular column ingot 205 having a longitudinal length b of 1250 mm, a lateral length a of 1250 mm, and a height c of 500 mm is obtained, when the rectangular column ingot 205 is separated along the arrow 211 indicating the crystal growth direction, the polycrystalline silicon layer 1251 of up to 1250 mm×500 mm can be obtained, and when the rectangular column ingot 205 is separated in the direction perpendicular to the arrow 211, the polycrystalline silicon layer 1251 of up to 1250 mm×1250 mm can be obtained.

Figure 11A:
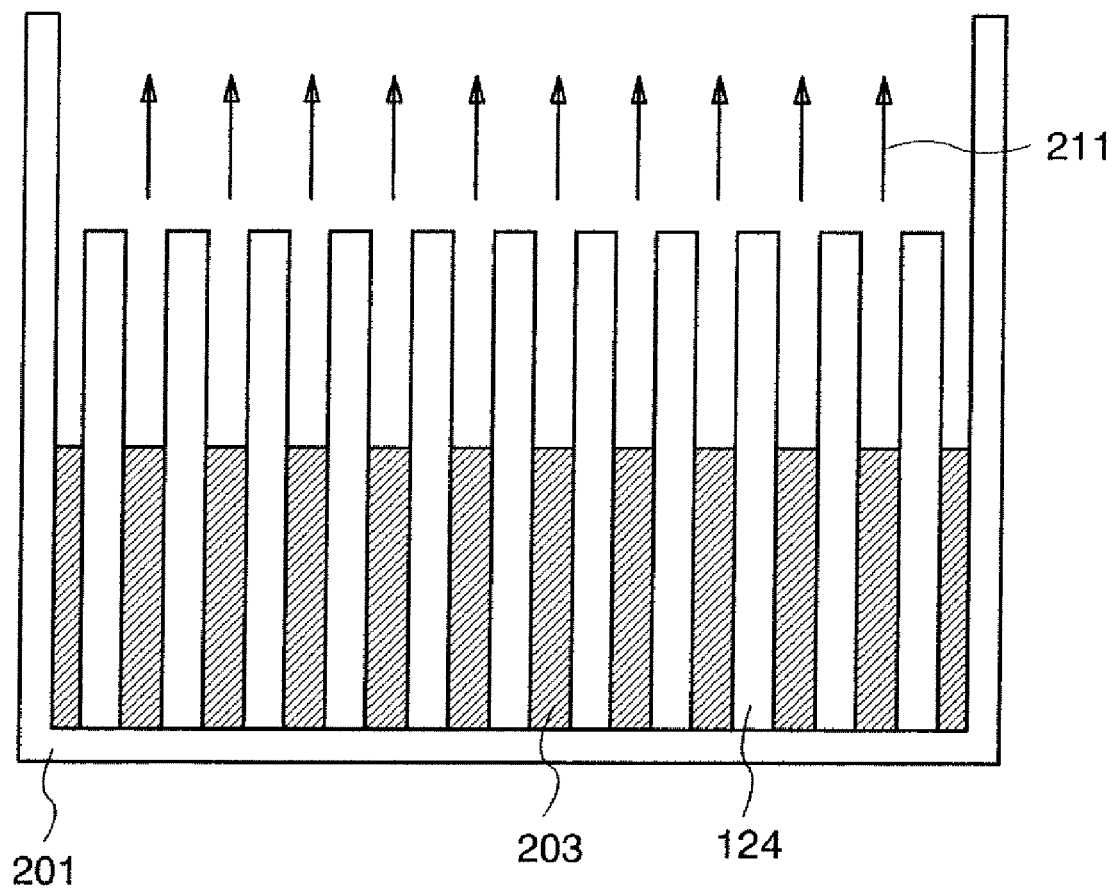
Figure 11B:
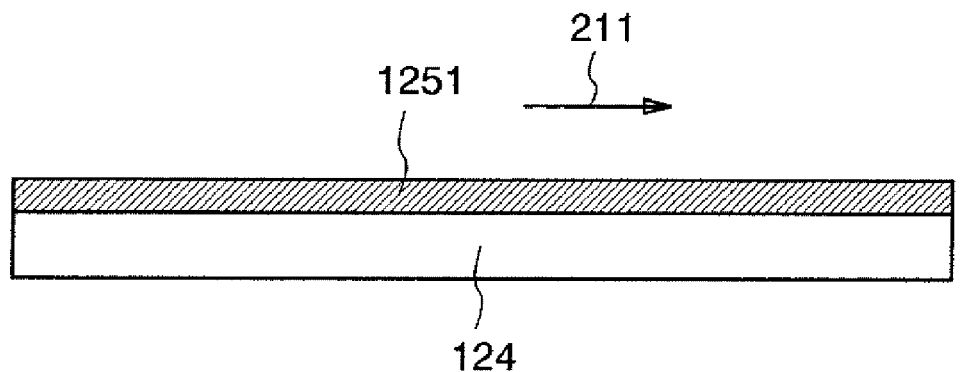

Further, in the step shown in FIG. 9C, if the substrate 124 is disposed instead of the partitions 204 (see FIG. 11A), the polycrystalline silicon layer 1251 having large area can be formed over the substrate 124 without the separation and bonding steps (see FIG. 11B). Moreover, a semiconductor device can be manufactured so that the transfer direction of carriers in an active layer agrees with the crystal growth direction indicated by the arrow 211. Thus, variations in the semiconductor device can be reduced.

Embodiment Mode 5

In this embodiment mode, an example of manufacturing a semiconductor device using a crystalline semiconductor layer having large area obtained by Embodiment Mode 1 to Embodiment Mode 4 will be described with reference to FIGS. 12A to 12E, FIGS. 13A to 13B), FIGS. 14A to 14B, FIGS. 15A to 15C, FIG. 16, FIG. 17, and FIG. 27.

Figure 12A:
FIGS. 12A to 12E illustrate steps of manufacturing a semiconductor device using a crystalline semiconductor layer of the present invention.

First, based on Embodiment Mode 1 to Embodiment Mode 4, a crystalline silicon layer 302 is formed over a substrate 301, as a crystalline semiconductor layer (see FIG. 12A). The same substrate as the substrate 124 may be used as the substrate 301, and the silicon epitaxial layer 103, the single crystal silicon layer 151, the crystalline silicon layer 1151, and the polycrystalline silicon layer 1251 may be used as the crystalline silicon layer 302.

Figure 12B:
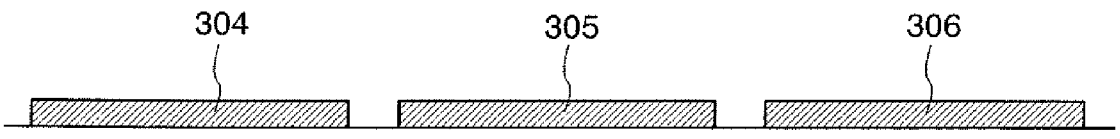

Next, the crystalline silicon layer 302 is etched to form a semiconductor island region 304, a semiconductor island region 305 and a semiconductor island region 306 (see FIG. 12B).

Note that as also described in Embodiment Mode 2, the crystal growth direction of the crystalline silicon layer 302 and the direction in which carriers flow in the semiconductor island region 306 are made to agree with each other, a semiconductor device with reduced variation can be manufactured.

Next, a gate insulating film 308 is formed over the semiconductor island region 304, the semiconductor island region 305, and the semiconductor island region 306. The gate insulating film 308 is formed to a thickness of 5 nm to 50 nm. Note that the gate insulating film 308 is preferably formed of a silicon oxide film or a silicon nitride film containing oxygen.

In this embodiment mode, the gate insulating film 308 is formed by vapor phase epitaxy. Note that in the case of forming the gate insulating film 308 with good quality at a temperature of 450° C. or lower, a plasma CVD method is preferably used. In particular, it is preferable to use a microwave plasma CVD method with an electron density approximately from $1\times10^{11}$ cm$^{-3}$ to $1\times10^{13}$ cm$^{-3}$ and an electron temperature approximately from 0.2 eV to 2.0 eV (preferably, from 0.5 eV to 1.5 eV). When electron density is high and electron temperature is low, a film with few defects due to less plasma damage can be formed using plasma with low kinetic energy of active species, a deposited film with less in which defects are reduced can be formed.

Figure 12C:
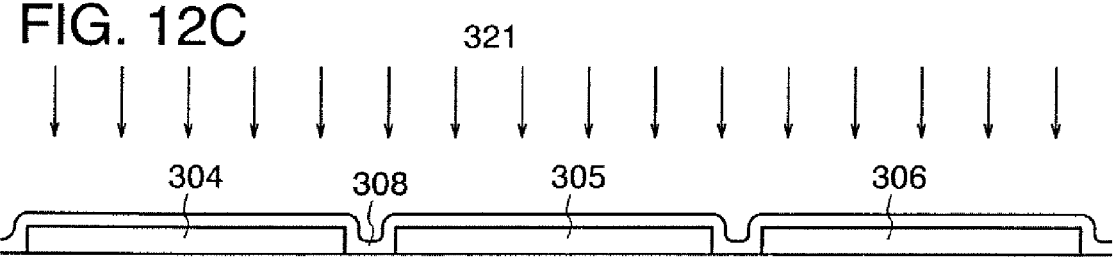

After forming the gate insulating film 308, an impurity element 321 which imparts p-type conductivity may be added to the semiconductor island region 304, the semiconductor island region 305, and the semiconductor island region 306 (see FIG. 12C). Note that in this embodiment mode, the impurity element 321 is added after the gate insulating film 308 is formed; however, may be added before forming the gate insulating film 308. Further, before forming the semiconductor island regions 304 to 306, the impurity element 321 may be added to the crystalline silicon layer 302.

The impurity element 321 which imparts p-type conductivity is added for controlling the threshold value of a transistor to be completed in a later step; however, the impurity element 321 which imparts p-type conductivity is not necessarily added if not required.

After forming the gate insulating film 308, a conductive film is formed over the gate insulating film 308 and is etched to form a gate electrode. In this embodiment mode, a first conductive film and a second conductive film are formed over the gate insulating film 308 are etching to form a gate electrode having a layered structure, As a conductive film used for forming the gate electrode, for example, a metal element such as silver (Ag), gold (Au), copper (Cu), nickel (Ni), platinum (Pt), palladium (Pd), iridium (Ir), rhodium (Rh), tungsten (W), aluminum (Al), tantalum (Ta), molybdenum (Mo), cadmium (Cd), zinc (Zn), iron (Fe), titanium (Ti), silicon (Si), germanium (Ge), zirconium (Zr), barium (Ba), or neodymium (Nd), an alloy material having the metal element as a main component, a compound material such as a metal nitride containing the metal element, or a material using more than one of those can be used.

In this embodiment mode, molybdenum (Mo) is used for the first conductive film, and tungsten (W) is used for the second conductive film.

Figure 12D:
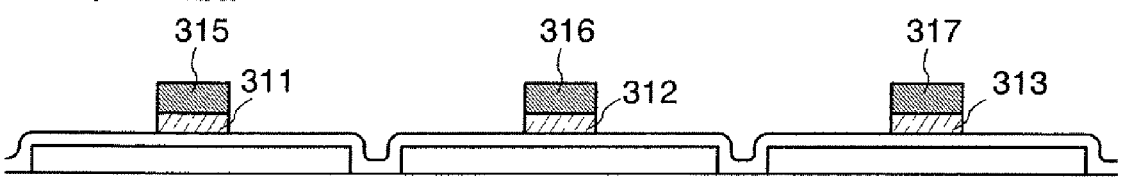
Figure 12E:
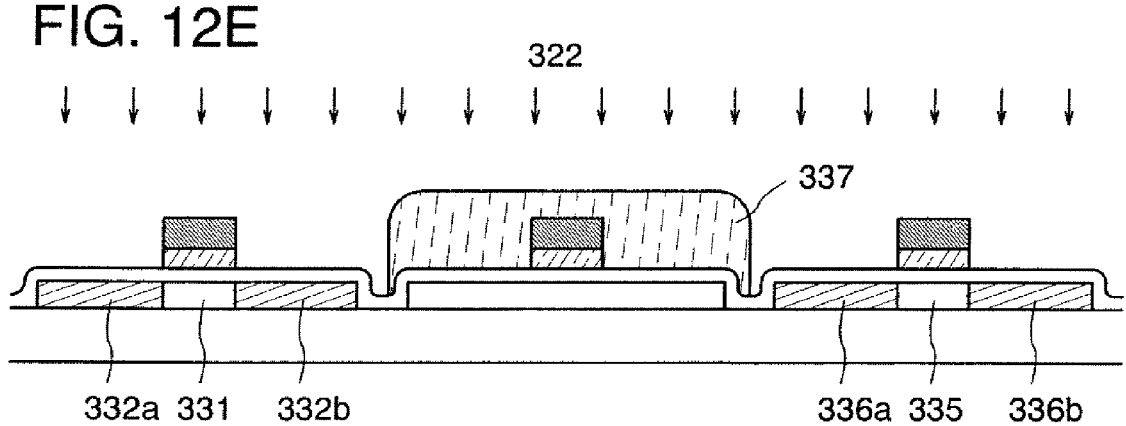

A a gate electrode 311 and a gate electrode 315 are formed over the semiconductor island region 304 with the gate insulating film 308 therebetween, a gate electrode 312 and a gate electrode 316 are formed over the semiconductor island region 305 with the gate insulating film 308 therebetween, and a gate electrode 313 and a gate electrode 317 are formed over the semiconductor island region 306 with the gate insulating film 308 therebetween (see FIG. 12D). In this embodiment mode, the gate electrodes 311 to 313 are formed of molybdenum, and the gate electrodes 315 to 317 are formed of tungsten.

Note that in this embodiment mode, gate electrodes having a two-layer structure of the gate electrode 311 and the gate electrode 315, the gate electrode 312 and the gate electrode 316, and the gate electrode 313 and the gate electrode 317, respectively are formed; however, the present invention is not limited thereto. The gate electrode may be formed using a single layer conductive film or have a layered structure of three or more layers.

Next, a resist mask 337 is formed over the semiconductor island region 305, and is doped with an impurity element 322 which imparts n-type conductivity, for example, phosphorus (P) at a first concentration. The impurity element 322 which imparts n-type conductivity is not added to the semiconductor island region 305. Further, in the semiconductor island region 304, since the gate electrode 311 and the gate electrode 315 serve as masks, the impurity element 322 which imparts n-type conductivity is not added to regions below the gate electrode 311 and the gate electrode 315. Moreover, in the semiconductor island region 306, since the gate electrode 313 and the gate electrode 317 serve as masks, the impurity element 322 which imparts n-type conductivity is not added to regions below the gate electrode 313 and the gate electrode 317.

Thus, in the semiconductor island region 304, an impurity region 332a and an impurity region 332b, and a channel formation region 331 between the impurity region 332a and the impurity region 332b are formed. Further, in the semiconductor island region 306, impurity region 336a and impurity region 336b and a channel formation region 335 between the impurity region 336a and the impurity region 336b are formed (see FIG. 12E). As the impurity element 322 which imparts n-type conductivity, arsenic (As) may be used other than phosphorus (P).

Next, a resist mask 338 is formed over the semiconductor island region 304, a resist mask 339 is formed over the semiconductor island region 306, and the semiconductor island region 304 and the semiconductor island region 306 are doped with an impurity element 324 which imparts p-type conductivity, for example, boron (B) at a second concentration. The impurity element 324 which imparts p-type conductivity is not added to the semiconductor island region 304 and the semiconductor island region 306. Further, in the semiconductor island region 305, since the gate electrode 312 and the gate electrode 316 serves as masks, the impurity element 324 which imparts p-type conductivity is not added to regions below the gate electrode 312 and the gate electrode 316.

Figure 13A:
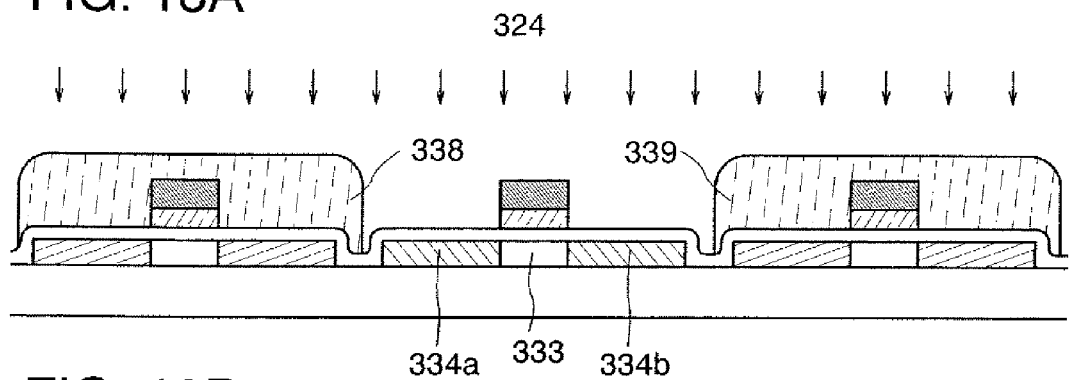
FIGS. 13A to 13D illustrate steps of manufacturing a semiconductor device using a crystalline semiconductor layer of the present invention.

Thus, in the semiconductor island region 305, the impurity region 334a and the impurity region 334b, and the channel formation region 333 between the impurity region 334a and the impurity region 334b are formed (see FIG. 13A).

Figure 13B:
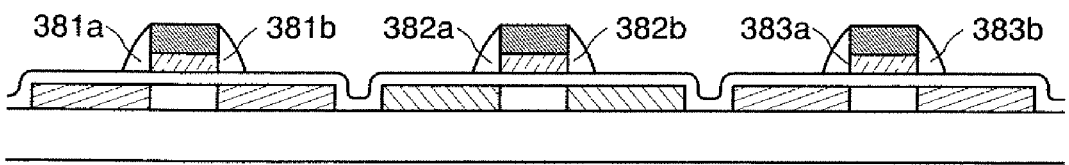

Next, an insulating film is formed over the gate insulating film 308, the gate electrodes 311 to 313, and the gate electrodes 315 to 317, and is etched by anisotropic etching so that a sidewall 381a and a sidewall 381b are formed on side surfaces of the gate electrode 311 and the gate electrode 315, a sidewall 382a and a sidewall 382b are formed on side surfaces of the gate electrode 312 and the gate electrode 316, and a sidewall 383a and a sidewall 383b are formed on side surfaces of the gate electrode 313 and the gate electrode 317 (see FIG. 13B). Any one of a silicon oxide film, a silicon nitride film containing nitrogen, a silicon nitride film, and a silicon nitride film containing oxygen or a layered film having two or more of them may be used as an insulating film which is a material of the sidewall 381a, the sidewall 381b, the sidewall 382a, the sidewall 382b, the sidewall 383a, and the sidewall 383b.

Next, a resist mask 355 is formed over the semiconductor island region 305 and is doped with an impurity element 325 which imparts n-type conductivity at a third concentration. The impurity element 325 which imparts n-type conductivity is not added to the semiconductor island region 305. Further, in the semiconductor island region 304, since the gate electrode 311 and the gate electrode 315, and the sidewall 381a and the sidewall 381b serve as mask, the impurity element 325 which imparts n-type conductivity is not added to the regions below the gate electrode 311 and the gate electrode 315, and the sidewall 381a and the sidewall 381b.

The impurity element 325 may be the same as or different from the impurity element 322; however, the third concentration is higher than the first concentration, and higher concentration impurity regions are formed in each of the impurity region 332a, the impurity region 332b, the impurity region 336a, and the impurity region 336b.

Figure 13C:
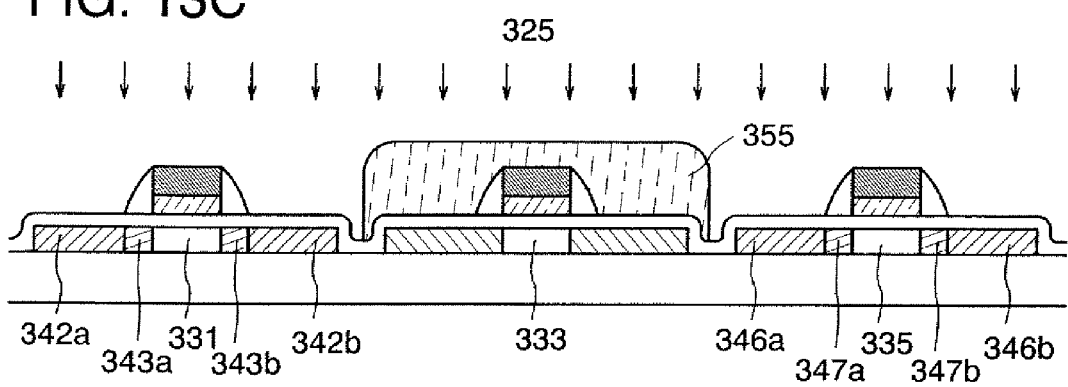

With the addition of the impurity element 325 which imparts n-type conductivity, a high-concentration impurity region 342a and a high-concentration impurity region 342b, a low-concentration impurity region 343a and a low-concentration impurity region 343b, and a channel formation region 331 are formed in the semiconductor island region 304. Further, a high-concentration impurity region 346a and a high-concentration impurity region 346b, a low-concentration impurity region 347a and a low-concentration impurity region 347b, and a channel formation region 335 are formed in the semiconductor island region 306 (see FIG. 13C).

Next, the resist mask 355 is removed; a resist mask 356 is formed over the semiconductor island region 304; and a resist mask 357 is formed over the semiconductor island region 306. The semiconductor island region 305 is doped with an impurity element 326 which imparts p-type conductivity at a fourth concentration. The impurity element 326 which imparts p-type conductivity may be the same as or different from the impurity element 324 which imparts p-type conductivity; however, the fourth concentration is higher than the second concentration, and higher concentration impurity regions are formed in the impurity region 334a and impurity region 334b.

Figure 13D:
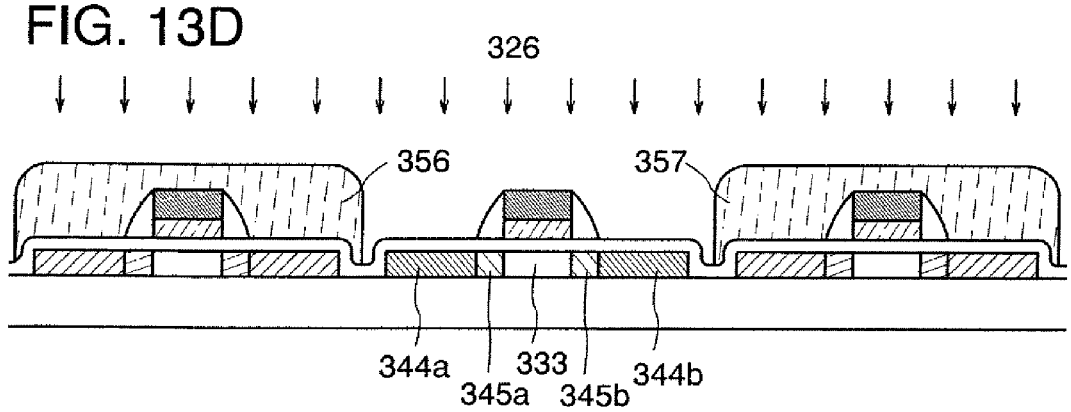
Figure 14A:
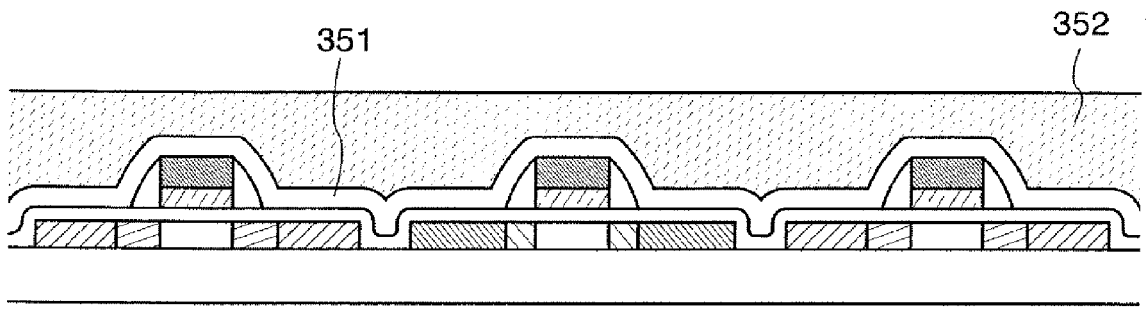
FIGS. 14A and 14B illustrate steps of manufacturing a semiconductor device using a crystalline semiconductor layer of the present invention.
Figure 14B:
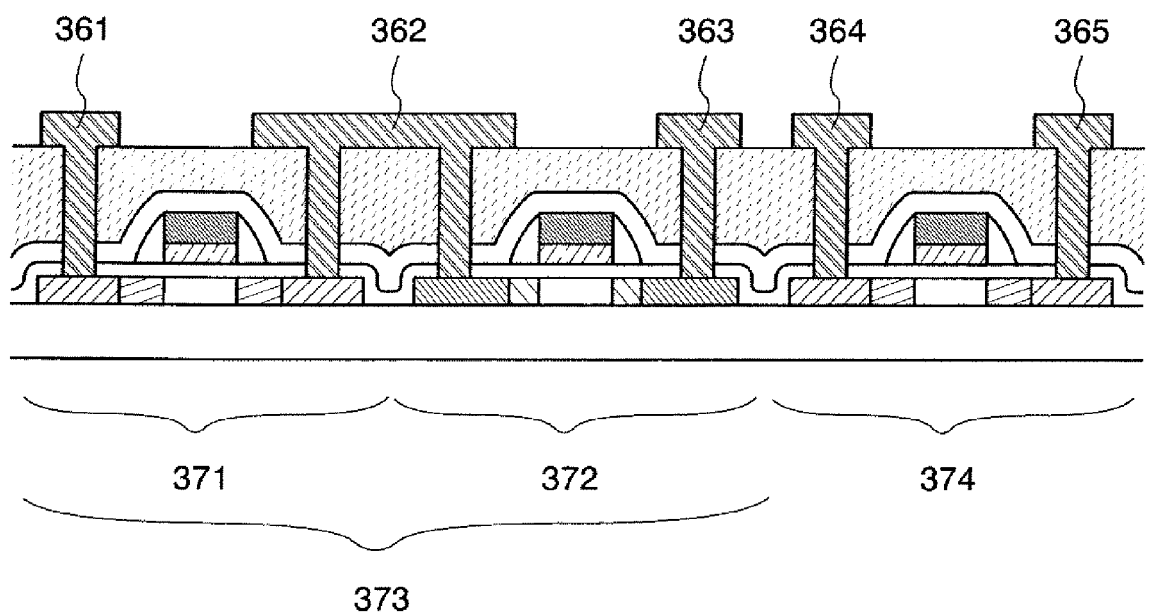

The semiconductor island region 305 id doped with the impurity element 326 which imparts p-type conductivity using the gate electrode 312 and the gate electrode 316, and the sidewall 382a and the sidewall 382b as masks; thus, a high-concentration impurity region 344a and a high-concentration impurity region 344b, a low-concentration impurity region 345a and a low-concentration impurity region 345b, and a channel formation region 333 are formed in the semiconductor island region 305 (see FIG. 13D).

Further, a method for forming an impurity region, which is different from the manufacturing process illustrated in FIG. 12E and FIGS. 13A to 13D will be described with reference to FIGS. 15A to 15C.

Figure 15A:
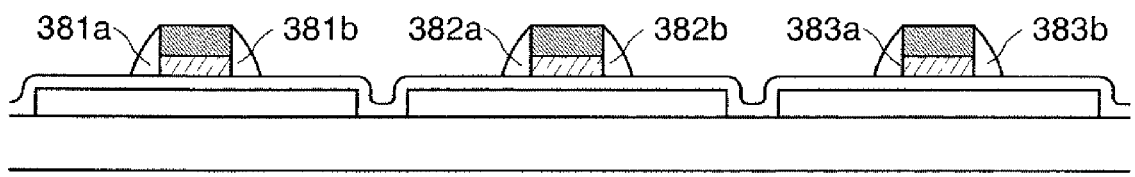
FIGS. 15A to 15C illustrate steps of manufacturing a semiconductor device using a crystalline semiconductor layer of the present invention.
Figure 15B:
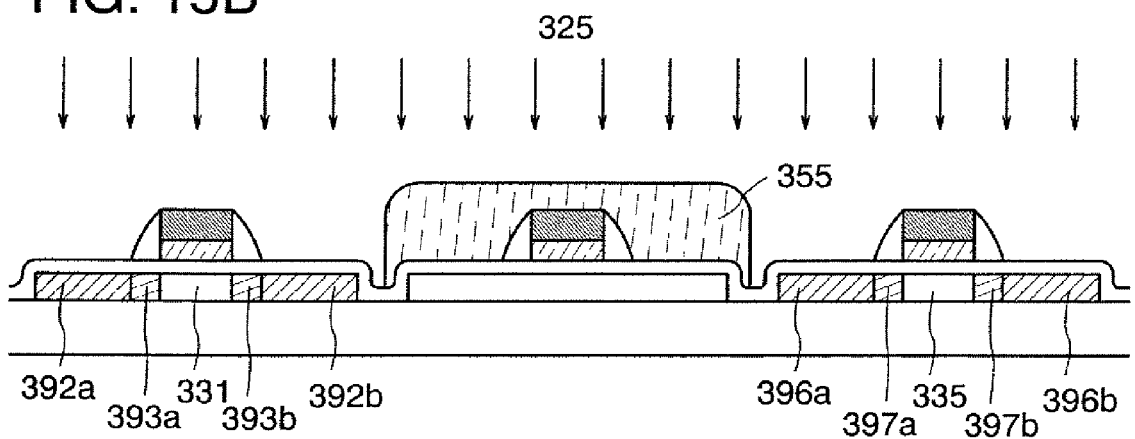

First, after performing the steps up to and including the steps of forming the gate electrodes 311 to 313 and 315 to 317 shown in FIG. 12D, based on the manufacturing step of FIG. 13B, the sidewall 381a and the sidewall 381b are formed on side surfaces of the gate electrode 311 and the gate electrode 315, the sidewall 382a and the sidewall 382b are formed on side surfaces of the gate electrode 312 and the gate electrode 316, and the sidewall 383a and the sidewall 383b are formed on side surfaces of the gate electrode 313 and the gate electrode 317 (see FIG. 15A).

The resist mask 355 is formed over the semiconductor island region 305, and the semiconductor island region 304 and the semiconductor island region 306 are doped with the impurity element 325 which imparts n-type conductivity. The impurity element 325 which imparts n-type conductivity passes through the sidewall 381a and the sidewall 381b and is added to the semiconductor island region 304; therefore, the concentration of regions in the semiconductor island region 304 below the sidewall 381a and sidewall 381b is higher than the concentration of regions where the sidewall 381a and the sidewall 381b are not formed. This also applies to the semiconductor island region 306.

With the addition of the impurity element 325 which imparts n-type conductivity, a high-concentration impurity region 392a and high-concentration impurity region 392b, a low-concentration impurity region 393a and a low-concentration impurity region 393b, and the channel formation region 331 are formed in the semiconductor island region 304. Further, in the semiconductor island region 306, a high-concentration impurity region 396a and a high-concentration impurity region 396b, a low-concentration impurity region 397a and a low-concentration impurity region 397b, and a channel formation region 335 are formed (see FIG. 15B).

Next, the resist mask 355 is removed; the resist mask 356 is formed over the semiconductor island region 304; the resist mask 357 is formed over the semiconductor island region 306, and the semiconductor island region 305 is doped with the impurity element 326 which imparts p-type conductivity.

The impurity element 326 which imparts p-type conductivity passes through the sidewall 382a and the sidewall 382b and is added to the semiconductor island region 305; thus, the concentration of regions in the semiconductor island region 305 below the sidewall 382a and the sidewall 382b becomes lower than that of regions where the sidewall 382a and the sidewall 382b.

Figure 15C:
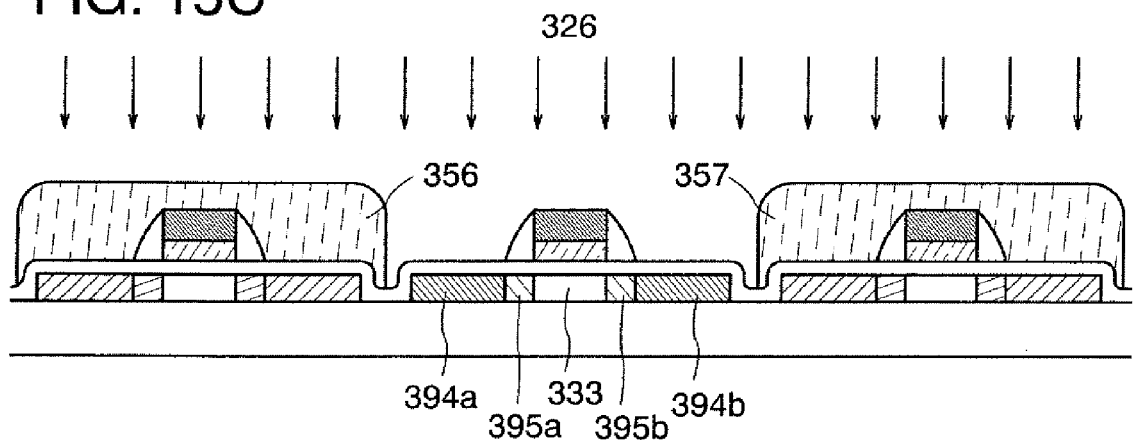

With the addition of the impurity element 326 which imparts p-type conductivity, in the semiconductor island region 305, a high-concentration impurity region 394a and a high-concentration impurity region 394b, a low-concentration impurity region 395a and a low-concentration impurity region 395b, and the channel formation region 333 are formed (see FIG. 15C).

After completing the manufacturing step shown in FIG. 13D or FIG. 15C, the resist mask 356 and the resist mask 357 are removed. A protective film 351 is formed so as to cover the semiconductor island regions 304 to 306, the gate electrodes 311 to 313, the gate electrodes 315 to 317, the sidewall 381a, the sidewall 381b, the sidewall 382a, the sidewall 382b, the sidewall 383a, and the sidewall 383b.

A silicon nitride film or a silicon nitride film containing oxygen can be used for the protective film 351. An interlayer insulating film 352 is formed over the protective film 351. An inorganic insulating film such as a silicon oxide film, a silicon nitride film, a silicon nitride film containing nitrogen, a silicon nitride film containing oxygen, a single-layer film of a BPSG (borophosphosilicate glass) film or an organic resin film typified by a polyimide film, or a layered film in which two or more such layers are stacked can be used as the interlayer insulating film 352 (see FIG. 14A).

Contact holes are formed in the interlayer insulating film 352; a conductive film is formed to cover the interlayer insulating film 352 and the contact holes, and the conductive film is etched to form wirings 361 to 365.

As a conductive film for forming the wirings 361 to 365, a conductive film in which a lower layer of a metal film of molybdenum, chromium, titanium, an intermediate layer of an aluminum film or an aluminum alloy film, and an upper layer of a metal film of molybdenum, chromium, titanium, or the like are stacked may be used. A metal film of molybdenum, chromium, titanium, or the like serves as a barrier metal of an aluminum film or an aluminum alloy film.

The wiring 361 is electrically connected to the high-concentration impurity region 342a or the high-concentration impurity region 392a through the contact hole provided in the interlayer insulating film 352 and the protective film 351. The wiring 362 is electrically connected to the high-concentration impurity region 342b or the high-concentration impurity region 392b and the high-concentration impurity region 344a or the high-concentration impurity region 394a. The wiring 363 is electrically connected to the high-concentration impurity region 344b or the high-concentration impurity region 394b. The wiring 364 is electrically connected to the high-concentration impurity region 346a or the high-concentration impurity region 396a. The wiring 365 is electrically connected to the high-concentration impurity region 346b or the high-concentration impurity region 396b (see FIG. 14B).

A transistor 371 including the semiconductor island region 304 having the high-concentration impurity region 342a and the high-concentration impurity region 342b that are source and drain regions, the low-concentration impurity region 343a and the low-concentration impurity region 343b, and the channel formation region 331; the gate insulating film 308; and the gate electrode 311 and the gate electrode 315 is an n-channel transistor. A transistor 372 including the semiconductor island region 305 having the high-concentration impurity region 344a and the high-concentration impurity region 344b that are source and drain regions, the low-concentration impurity region 345a and the low-concentration impurity region 345b, and the channel formation region 333; the gate insulating film 308; and the gate electrode 312 and the gate electrode 316 is a p-channel transistor. A transistor 374 including the semiconductor island region 306 having the high-concentration impurity region 346a and the high-concentration impurity region 346b that are source and drain regions, the low-concentration impurity region 347a and the low-concentration impurity region 347b, and the channel formation region 335; the gate insulating film 308; and the gate electrode 313 and the gate electrode 317 is an n-channel transistor. The transistor 371 and the transistor 372 are included in a CMOS circuit 373.

Similarly, the transistor 371 including the semiconductor island region 304 having the high-concentration impurity region 392a and the high-concentration impurity region 392b that are source and drain regions, the low-concentration impurity region 393a and the low-concentration impurity region 393b, and the channel formation region 331; the gate insulating film 308; and the gate electrode 311 and the gate electrode 315 is an n-channel transistor. The transistor 372 including the semiconductor island region 305 having the high-concentration impurity region 394a and the high-concentration impurity region 394b that are source and drain regions, the low-concentration impurity region 395a and the low-concentration impurity region 395h, and the channel formation region 333; the gate insulating film 308; and the gate electrode 312 and the gate electrode 316 is a p-channel transistor. The transistor 374 including the semiconductor island region 306 having the high-concentration impurity region 396a and the high-concentration impurity region 396b that are source and drain regions, the low-concentration impurity region 397a and the low-concentration impurity region 397b, and the channel formation region 335; the gate insulating film 308; and the gate electrode 313 and the gate electrode 317 is an n-channel transistor. The transistor 371 and the transistor 372 are included in a CMOS circuit 373.

Note that as for the transistor 372 which is a p-channel transistor, high-concentration impurity regions which are source and drain regions may be formed without forming the low-concentration impurity region 345a and the low-concentration impurity region 345b, or the low-concentration impurity region 395a and the low-concentration impurity region 395b. In that case, in the in the semiconductor island region 305, a channel formation region 333 is formed in a region below the gate electrode 312 and the gate electrode 316, and high-concentration impurity regions are formed in regions other than the region. In order to obtain such a structure, after forming the gate electrode 312 and the gate electrode 316 over the semiconductor island region 305, an impurity element which imparts p-type conductivity may be added at a high concentration.

Further, in the case of using a p-channel transistor independently, the wiring 362 is not connected to the n-channel transistor 372.

Further, in this embodiment mode, sidewalls are formed; however, only the gate electrodes may be formed without forming sidewalls if not required. In that case, as a mask for doping with an impurity which imparts one conductivity, any one of a gate electrode, a gate insulating film, and a newly formed resist mask, or a combination of two or more of them may be used.

Figure 27:
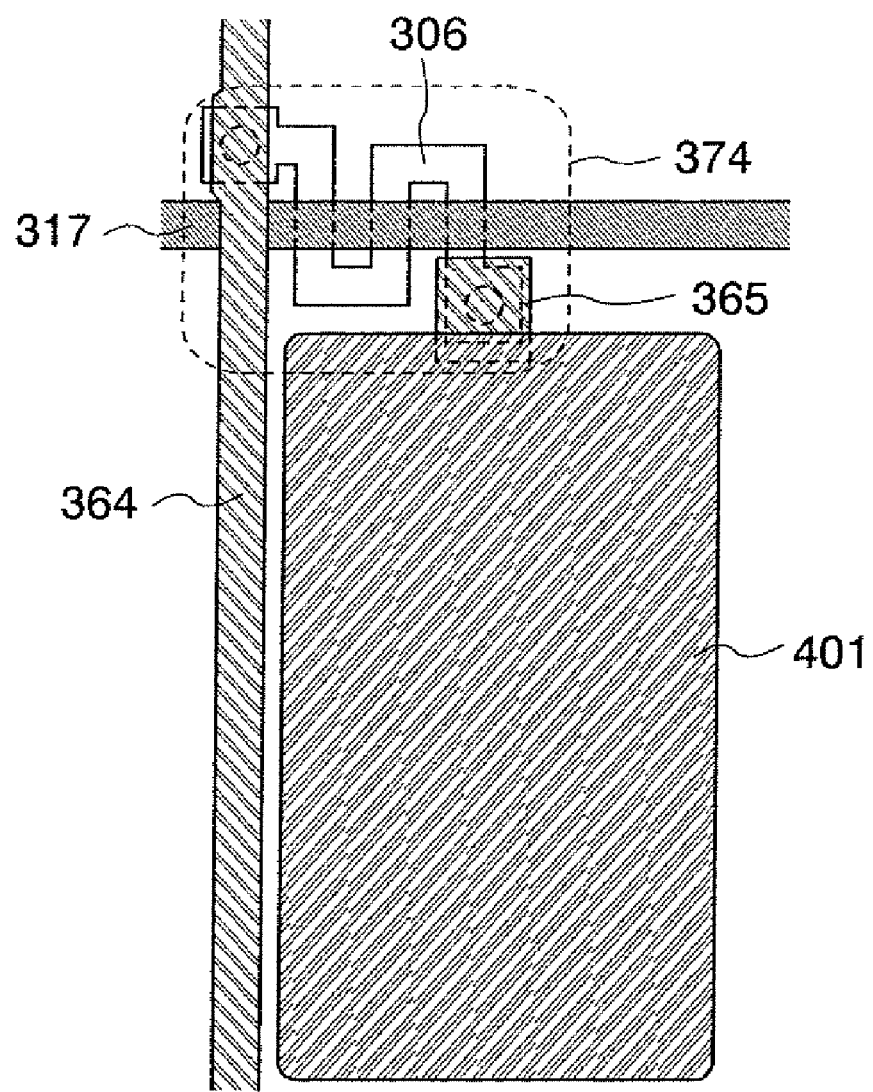
FIG. 27 is a top view of one pixel of the present invention.

An example of applying the CMOS circuit 373 and transistor 374 formed in accordance with this embodiment mode to a liquid crystal display device will be described with reference to FIG. 16, FIG. 17, and FIG. 27.

Figure 16:
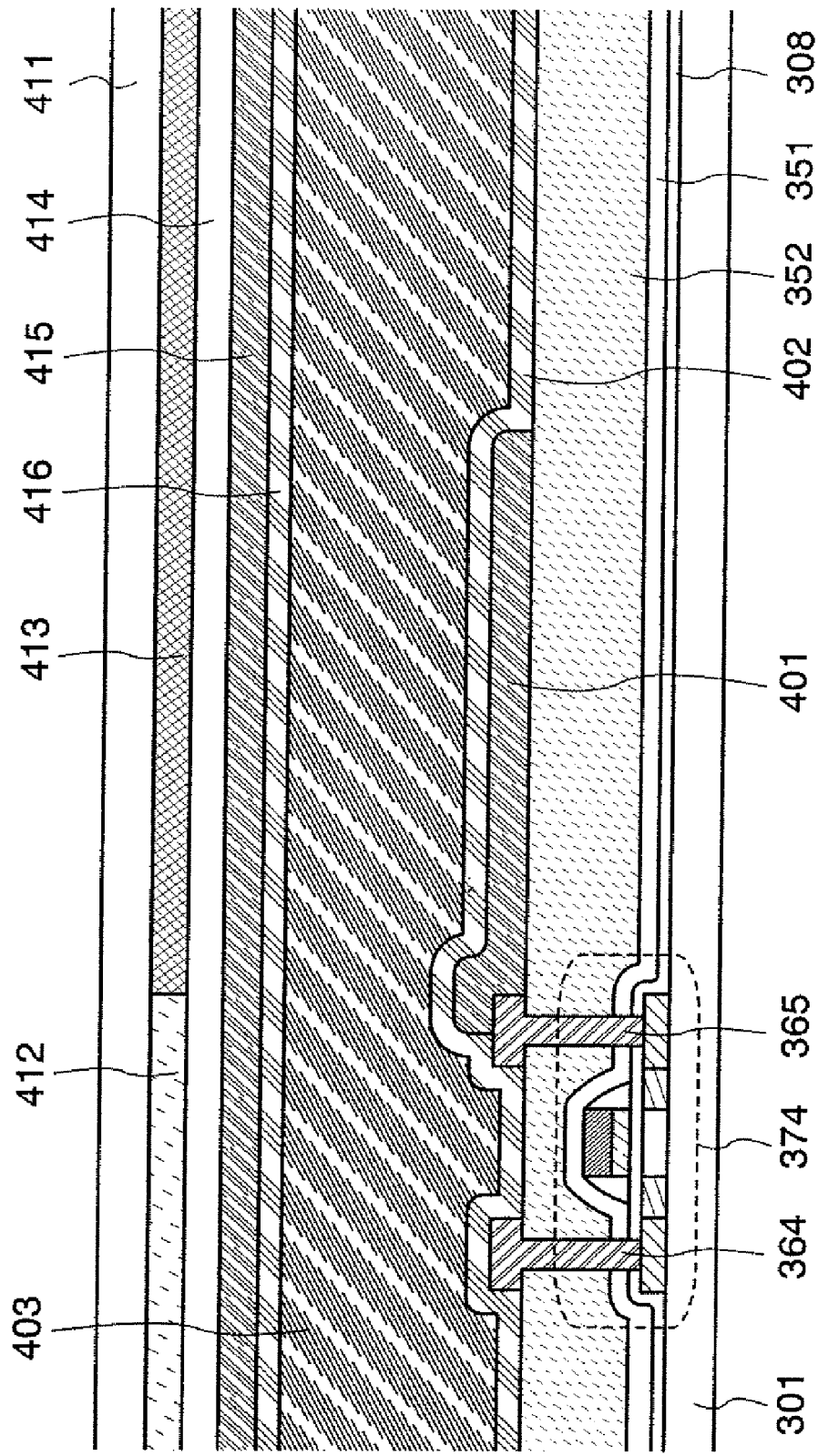
FIG. 16 illustrates a step of manufacturing a semiconductor device using a crystalline semiconductor layer of the present invention.

FIG. 16 illustrates a cross section of a pixel portion of a liquid crystal display device. An alignment layer 402 is formed to cover the transistor 374 serving as a pixel transistor, the interlayer insulating film 352, and a pixel electrode 401. Note that the alignment layer 402 may be formed by a droplet discharge method, screen printing, or offset printing. After that, rubbing treatment is performed on a surface of the alignment layer 402.

Then, the counter substrate 411 is provided with a color filter including a light blocking layer 412 (also referred to as a black matrix), a color layer 413, and an overcoat layer 414; further, a counter electrode 415 formed of a light-transmitting electrode and an alignment layer 416 thereover are formed. The counter electrode 415 is formed of a light-transmitting electrode; thus, the liquid crystal display device of this embodiment mode is a transmissive liquid crystal display device. Note that when the counter electrode 415 is formed of a reflective electrode, the liquid crystal display device of this embodiment mode becomes a reflective liquid crystal display device. Note that FIG. 27 is a top view illustrating the positional relationship between the transistor 374 and the pixel electrode 401 which are shown in FIG. 16.

Figure 17:
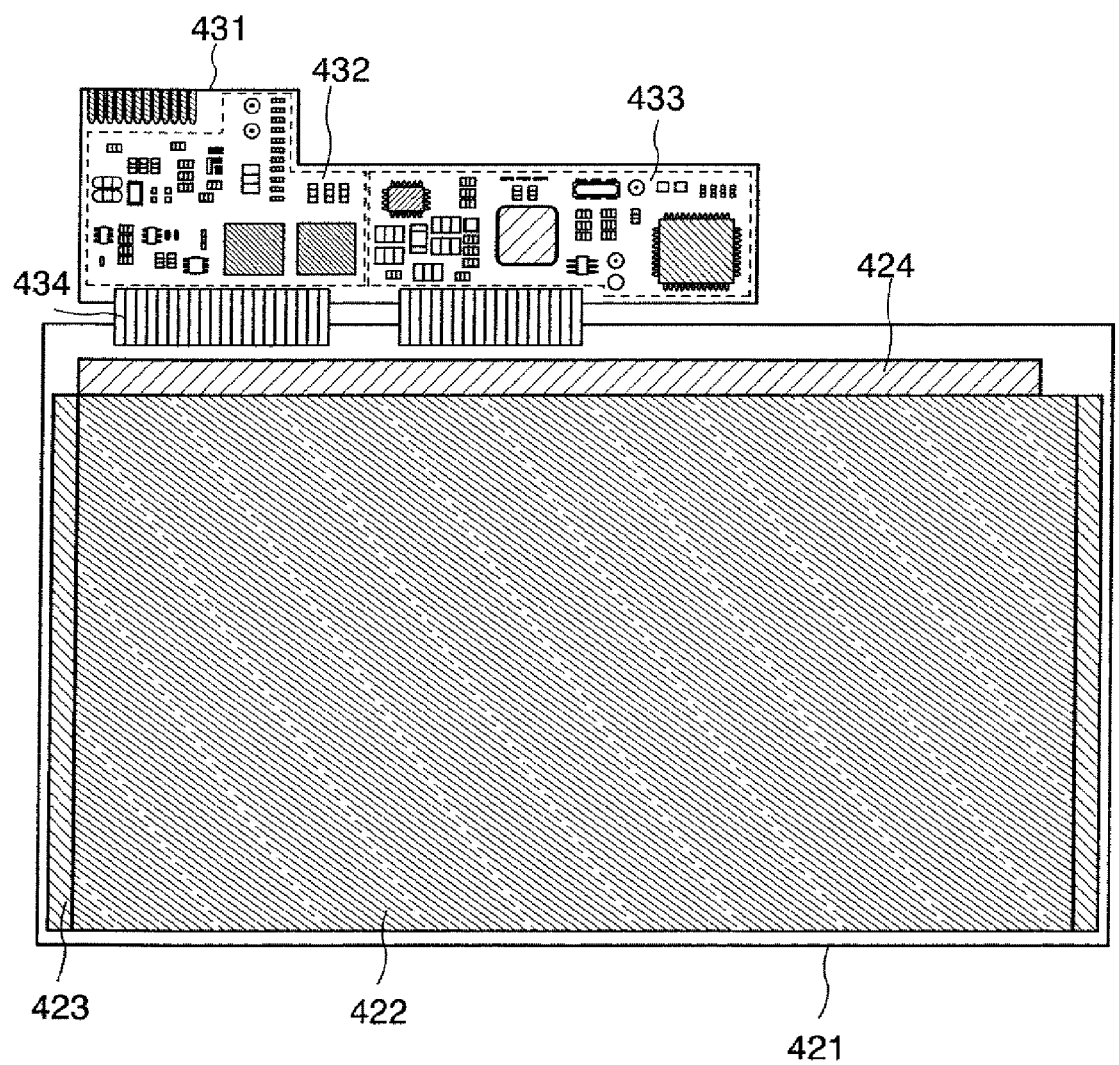
FIG. 17 illustrates an electronic device of the present invention.

FIG. 17 illustrates a liquid crystal display device having a pixel portion shown in FIG. 16. The liquid crystal display device shown in FIG. 17 includes a pixel portion 422 provided with a plurality of pixels, a scan line driver circuit 423, a liquid crystal display panel 421 having a signal line driver circuit 424 for supplying video signals to selected pixels, and a circuit substrate 431 over which a control circuit 432 and a signal separation circuit 433 are formed. The liquid crystal display panel 421 and the circuit substrate 431 are electrically connected to with a connection wiring 434.

Through the above steps, a transistor and a liquid crystal display device can be manufactured using an SOI substrate having a single crystal semiconductor film with increased area.

In this embodiment mode, the transistor is formed using a large single crystal silicon film with uniform crystal orientation, which is formed by the method described in Embodiment Mode 1 to Embodiment Mode 4, and thus uniform transistors with high performance can be obtained. Specifically, nonuniformity of important transistor characteristics such as threshold voltage and mobility are controlled, so that higher performance such as higher mobility can be achieved.

Embodiment Mode 6

In this embodiment mode, a light emitting device using a crystalline semiconductor layer in accordance with Embodiment Mode 1 to Embodiment Mode 4 and a transistor in accordance with Embodiment Mode 5 will be described with reference to FIGS. 26A and 26B.

Figure 26A:
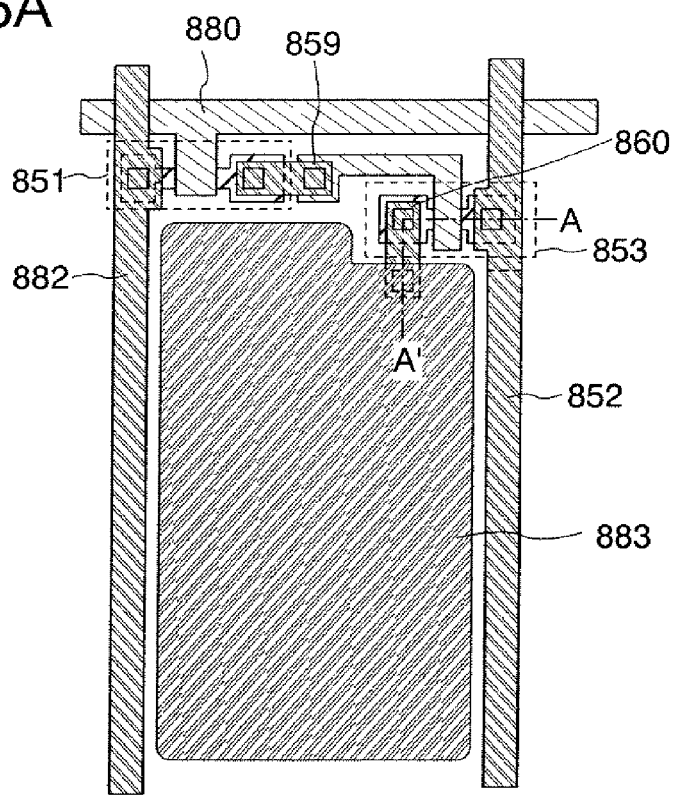
FIGS. 26A and 26B illustrate steps of manufacturing a semiconductor device using a crystalline semiconductor layer of the present invention.

FIG. 26A is a plan view of a pixel of the light emitting device, which includes a selection transistor 851 connected to a signal line 882 and a display control transistor 853 connected to a current line 852. The light-emitting device has a structure in which each pixel of the light-emitting device is provided with a light-emitting element that has a light emitting layer formed to contain an electroluminescent material between a pair of electrodes (also referred to as an EL layer). One of the electrodes forming the light emitting element is a pixel electrode 883, which is connected to the display control transistor 853. FIG. 26B is a cross-sectional view showing a main part of such a pixel.

Figure 26B:
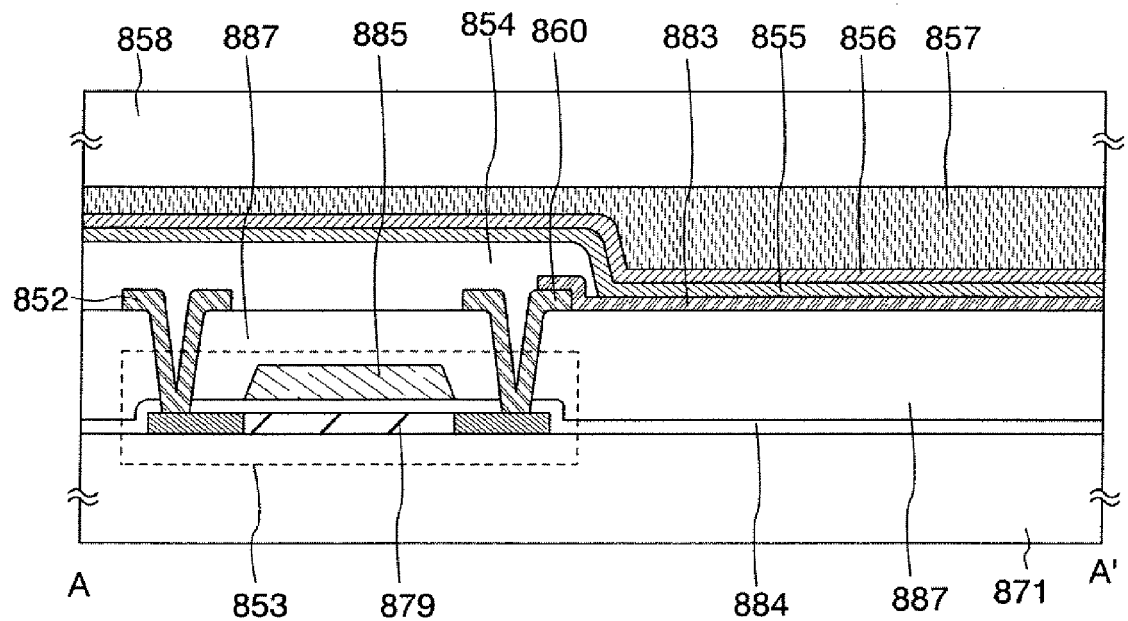

In FIG. 26B, there is a portion where a semiconductor film 879, a gate insulating film 884, and a gate electrode 885 are formed and stacked over the substrate 871. The selection transistor 851 and the display control transistor 853 are formed to have such a portion. The semiconductor film 879 may be a crystalline semiconductor layer in accordance with Embodiment Mode 1 to Embodiment Mode 4, and the selection transistor 851 and the display control transistor 853 may be transistors in accordance with Embodiment Mode 5.

Further, an interlayer insulating film 887 is formed to cover the gate electrode 885 of the display control transistor 853. The signal line 882, the current line 852, electrodes 859 and 860, and the like are formed over the interlayer insulating film 887. Further, the pixel electrode 883 electrically connected to the electrode 860 is formed over the interlayer insulating film 887. The periphery of the pixel electrode 883 is surrounded by the insulating partition layer 854. A light-emitting layer 855 is formed over the pixel electrode 883. A counter electrode 856 is formed over the light-emitting layer 855. The pixel portion is filled with a sealing resin 857, and is provided with a counter substrate 858 as a reinforcement plate.

One of a source region and a drain region of the selection transistor 851 is electrically connected to the signal line 882 as described above. Further, the other of the source region and the drain region of the selection transistor 851 is electrically connected to the gate electrode 885 of the display control transistor 853 through the electrode 859. Further, the selection transistor 851 has a gate wiring 880 connected to the gate electrode in series.

The light emitting device of this embodiment mode is formed using a large crystalline semiconductor layer, which is formed of a crystalline semiconductor layer with uniform crystal orientation; thus, variation of the characteristics between each transistor can be reduced. Note that a transistor formed from a crystalline semiconductor layer is, for example, excellent in all operating characteristics such as current drive capability than amorphous silicon transistors; therefore, the size of the transistor can be reduced, so that aperture ratio of a pixel portion in a display panel. Consequently, high quality display can be achieved.

Embodiment Mode 7

In this embodiment mode, a microprocessor will be described as an example of a semiconductor device manufactured using a crystalline semiconductor layer in accordance with Embodiment Mode 1 to Embodiment Mode 4 and a transistor in accordance with Embodiment Mode 5 with reference to FIG. 24.

Figure 24:
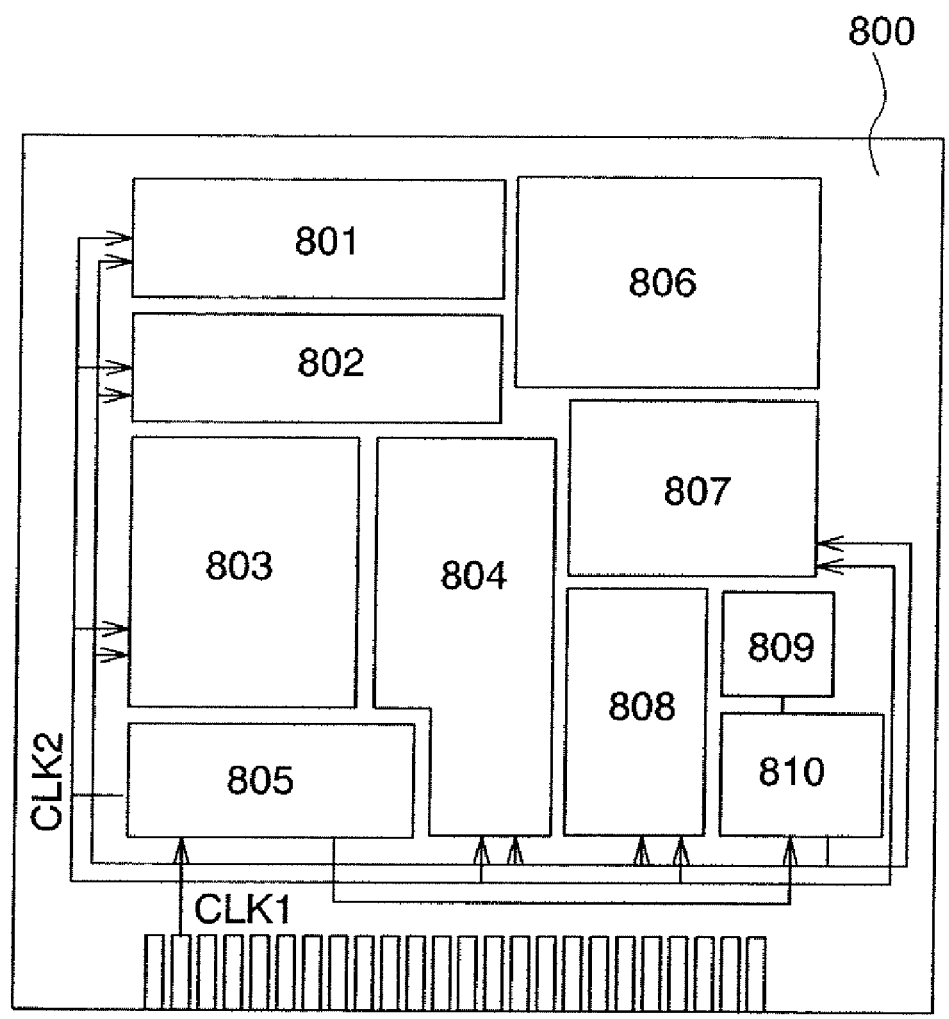
FIG. 24 is a block diagram of an electronic device of the present invention.

A microprocessor 800 shown in FIG. 24 includes an ALU 801, an ALU controller 802, an instruction decoder 803, an interrupt controller 804, a timing controller 805, a register 806, a register controller 807, a bus interface (Bus I/F) 808, a read only memory (ROM) 809, and a memory interface (ROM I/F) 810.

Each of one of or more of the ALU 801, the ALU controller 802, the instruction decoder 803, the interrupt controller 804, the timing controller 805, the register 806, the register controller 807, the bus interface 808, the read only memory 809, and the memory interface 810 is formed using the crystalline semiconductor layer of Embodiment Mode 1 to Embodiment Mode 4 and the transistor of Embodiment Mode 5.

An instruction inputted to the microprocessor 800 through the bus interface 808 is inputted to the instruction decoder 803, decoded therein, and then inputted to the ALU controller 802, the interrupt controller 804, the register controller 807, and the timing controller 805. The ALU controller 802, the interrupt controller 804, the register controller 807, and the timing controller 805 perform various controls based on the decoded instruction.

Specifically, the ALU controller 802 generates signals for controlling the operation of the ALU 801. While the microprocessor is executing a program, the interrupt controller 804 processes an interrupt request from an external input/output device or a peripheral circuit based on its priority or the mask state. The register controller 807 generates an address of the register 806, and reads/writes data from/to the register 806 in accordance with the state of the microprocessor. The timing controller 805 generates signals for controlling timing of operations of the ALU 801, the ALU controller 802, the instruction decoder 803, the interrupt controller 804, and the register controller 807. For example, the timing controller 805 is provided with an internal clock generator for generating an internal clock signal CLK2 based on a reference clock signal CLK1, and supplies the internal clock signal CLK2 to the above circuits. Note that the microprocessor 800 shown in FIG. 24 is only an example of a simplified structure, and actually, microprocessors can have various structures depending on usage.

The microprocessor 800 according to this embodiment mode is manufactured using a large single crystal silicon film formed by the method described in Embodiment Mode 1 to Embodiment Mode 4, and an integrated circuit is formed using a semiconductor film having uniform crystal, and thus the thin film transistor can achieve low power consumption as well as high processing speed.

Embodiment Mode 8

In this embodiment mode, as an example of a semiconductor device manufactured using a crystalline semiconductor layer in accordance with Embodiment Mode 1 to Embodiment Mode 4 and a transistor in accordance with Embodiment Mode 5, a semiconductor device having an arithmetic function, which is capable of transmitting and receiving data without contact, will be described with reference to FIG. 25.

Figure 25:
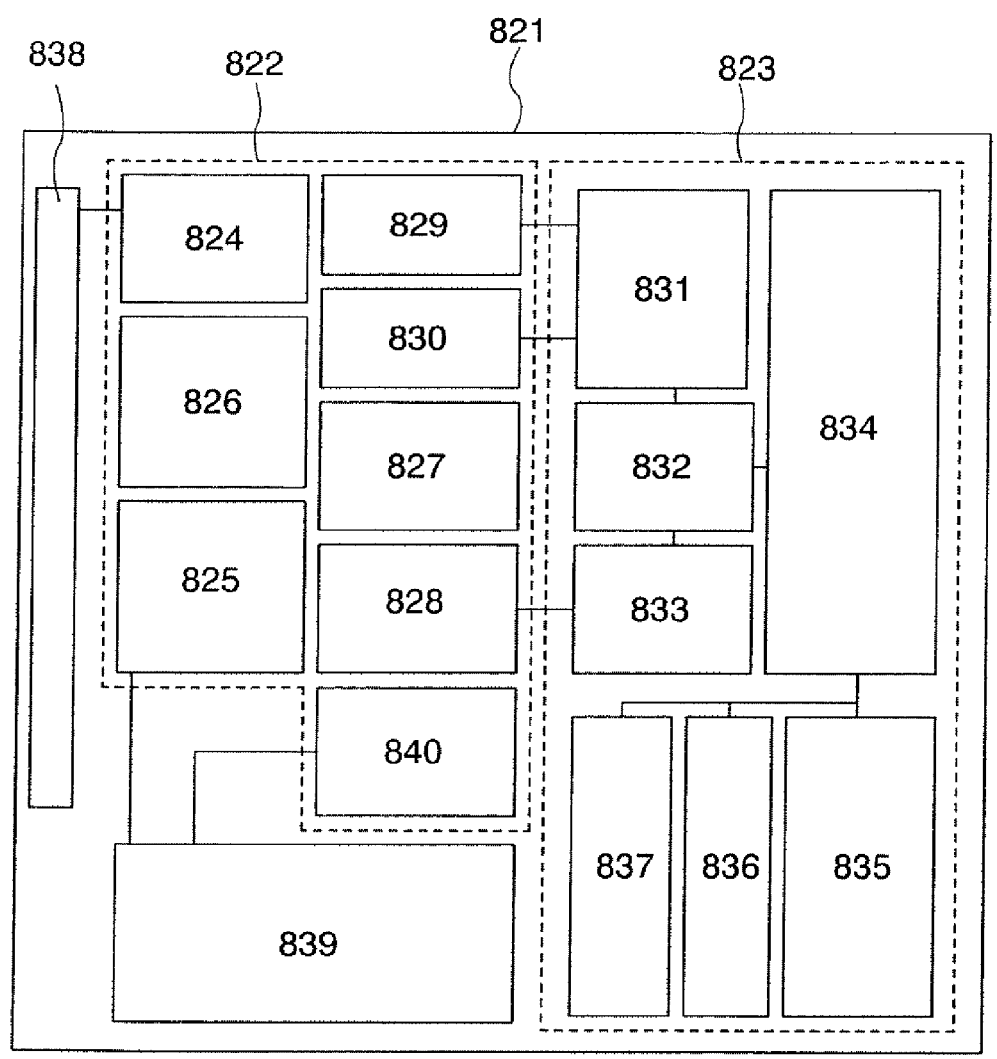
FIG. 25 is a block diagram of an electronic device of the present invention.

FIG. 25 is an example of a computer (hereinafter referred to as an RFCPU) which operates by transmitting and receiving signal to/from an external device by wireless communication. An RFCPU 821 has an analog circuit portion 822 and a digital circuit portion 823. The analog circuit portion 822 includes a resonant circuit 824 having a resonant capacitor, a rectifier circuit 825, a constant voltage circuit 826, a reset circuit 827, an oscillator circuit 828, a demodulation circuit 829, and a modulation circuit 830. The digital circuit portion 823 includes an RF interface 831, a control register 832, a clock controller 833, a CPU interface 834, a central processing unit (CPU) 835, a random access memory (RAM) 836, and a read only memory (ROM) 837.

Each of, one of or more of the resonant circuit 824, the rectification circuit 825, the constant voltage circuit 826, the reset circuit 827, the oscillator circuit 828, the demodulation circuit 829, the modulation circuit 830, the RF interface 831, the control register 832, the clock controller 833, the CPU interface 834, the CPU 835, the RAM 836, and the ROM 837 is formed using the crystalline semiconductor layer of Embodiment Mode 1 to Embodiment Mode 4 and the transistor of Embodiment Mode 5.

The operation of the RFCPU 821 having such a structure is roughly described below. A signal received at an antenna 838 causes induced electromotive force at the resonant circuit 824. The induced electromotive force is stored in a capacitor portion 839 via the rectifier circuit 825. The capacitor portion 839 is preferably formed using a capacitor such as a ceramic capacitor or an electric double layer capacitor. The capacitor portion 839 may be formed over the same substrate as the RFCPU 821 or may be attached as another component to a substrate having an insulating surface that partially constitutes the RFCPU 821.

The reset circuit 827 generates a signal that resets the digital circuit portion 823 to be initialized. For example, the reset circuit 827 generates, as a reset signal, a signal that rises with delay after increase in the power supply voltage. The oscillation circuit 828 changes the frequency and the duty ratio of a clock signal in accordance with a control signal generated by the constant voltage circuit 826. The demodulation circuit 829 including a low pass filter, for example, binarizes changes in amplitude of reception signals of an amplitude shift keying (ASK) system. The modulation circuit 830 changes the amplitude of transmission signals of an amplitude shift keying (ASK) system to be transmitted. The modulation circuit 830 changes the resonance point of the resonance circuit 824, thereby changing the amplitude of communication signals. The clock controller 833 generates a control signal for changing the frequency and the duty ratio of the clock signal in accordance with power supply voltage or current consumption in the CPU 835. The power supply voltage is monitored by the power supply control circuit 840.

A signal that is inputted to the RFCPU 821 from the antenna 838 is demodulated by the demodulation circuit 829, and then divided into a control command, data, and the like by the RF interface 831. The control command is stored in the control register 832. The control command includes, reading of data stored in the ROM 837, writing of data to the RAM 836, an arithmetic instruction to the CPU 835, and the like. The CPU 835 accesses the ROM 837, the RAM 836, and the control register 832 via the CPU interface 834. The CPU interface 834 has a function of generating an access signal for any one of the ROM 837, the RAM 836, and the control register 832 based on an address requested by the CPU 835.

As an arithmetic method of the CPU 835, a method may be employed in which the ROM 837 stores an OS (operating system) and reading program is executed at the time of starting operation. Alternatively, a method may be employed in which an arithmetic circuit is formed with a dedicated circuit and an arithmetic process is conducted using hardware. In a method in which both hardware and software are used, a method can be used in which a part of process is conducted in a dedicated arithmetic circuit and the other part of the arithmetic process is conducted by the CPU 835 using a program.

The RFCPU 821 according to this embodiment mode is formed using a large single crystal semiconductor film formed by the method described in Embodiment Modes 1 to 4, and an integrated circuit is formed using a semiconductor film having constant crystal orientation, and thus the RFCPU can achieve low power consumption as well as high processing speed. This makes it possible to ensure the operation for a long period of time even when the capacitor portion 839 which supplies power is downsized. Although FIGS. 11A and 11B illustrate the mode of the RFCPU, a device such as an IC tag can be applied, as long as it has a communication function, an arithmetic processing function, and a memory function.

Embodiment Mode 9

In this embodiment mode, electronic devices to which a crystalline semiconductor layer and Embodiment Mode 1 to Embodiment Mode 4 and a liquid crystal display device of Embodiment Mode 5 are applied will be described with reference to FIG. 18, FIGS. 19A and 19B, FIGS. 20A and 20B, FIG. 21, FIGS. 22A to 22E, FIGS. 23A and 23B, and FIGS. 28A to 28C.

Figure 18:
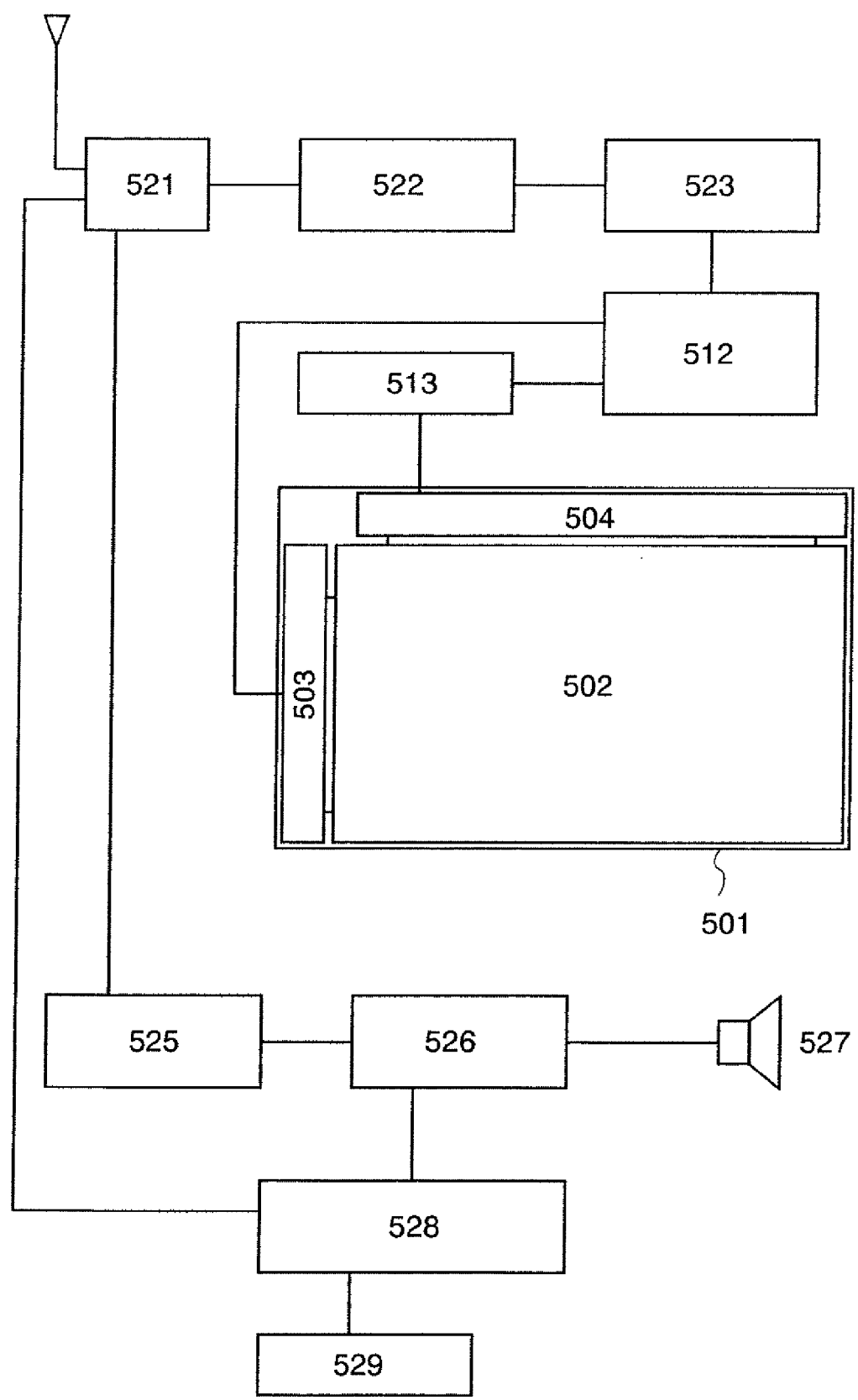
FIG. 18 is a block diagram of an electronic device of the present invention.

FIG. 18 is a block diagram illustrating a main structure of a liquid crystal television receiver. The liquid crystal television receiver shown in FIG. 18 includes a liquid crystal display panel 501 having a pixel portion 502, a scan line driver circuit 503, and a signal line driver circuit 504. The liquid crystal display panel 501 may be manufactured based on Embodiment Mode 4. The pixel portion 502, the scan line the driver circuit 503, and the signal line driver circuit 504 are manufactured based on the pixel portion 422, the scan line driver circuit 423, and the signal line driver circuit 424, respectively, with reference to FIG. 17.

The liquid crystal display panel 501 is electrically connected to a control circuit 512 and a signal separation circuit 513. The control circuit 512 and the signal separation circuit 513 are manufactured based on the control circuit 432 and the signal separation circuit 433 which are shown in FIG. 17, respectively. Further, the liquid crystal display panel 501, electrical connection between the control circuit 512, and the signal separation circuit 513 may be made by the same wiring as the connection wiring 434.

A tuner 521 receives a video signal and an audio signal. The video signal is processed by a video signal amplifier circuit 522, a video signal processing circuit 523 for converting a signal output from the video signal amplifier circuit 522 into a color signal corresponding to each color of red, green, and blue, and a control circuit 512 for converting the video signal into a signal which meets input specifications of a driver circuit. The control circuit 512 outputs signals to a scan line side and a signal line side. In the case of performing a digital drive, a structure can be used in which the signal separation circuit 513 is provided on the signal line side to supply an input digital signal divided into m (m is a positive integer) pieces.

The audio signal among the signals received by the tuner 521 is transmitted to an audio signal amplifier circuit 525, and an output of the audio signal amplifier circuit 525 is supplied to a speaker 527 through an audio signal processing circuit 526. A control circuit 528 receives control information of a receiving station (reception frequency) or sound volume from an input portion 529, and transmits signals to the tuner 521 and the audio signal processing circuit 526.

Figure 19A:
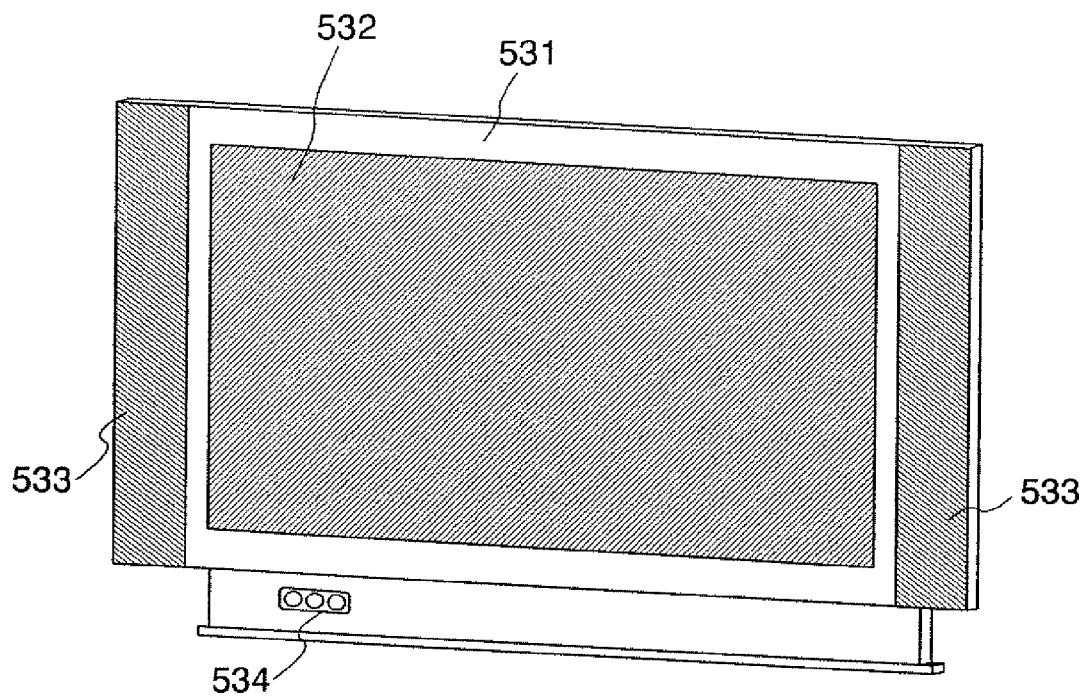
FIGS. 19A and 19B each illustrate an electronic device of the present invention.

As illustrated in FIG. 19A, a television receiver can be completed by incorporating the liquid crystal display device shown in FIG. 18 into a housing 531. A display screen 532 is formed using the liquid crystal display device. Further, speakers 533, operation switches 534, or the like may be provided as appropriate.

Figure 19B:
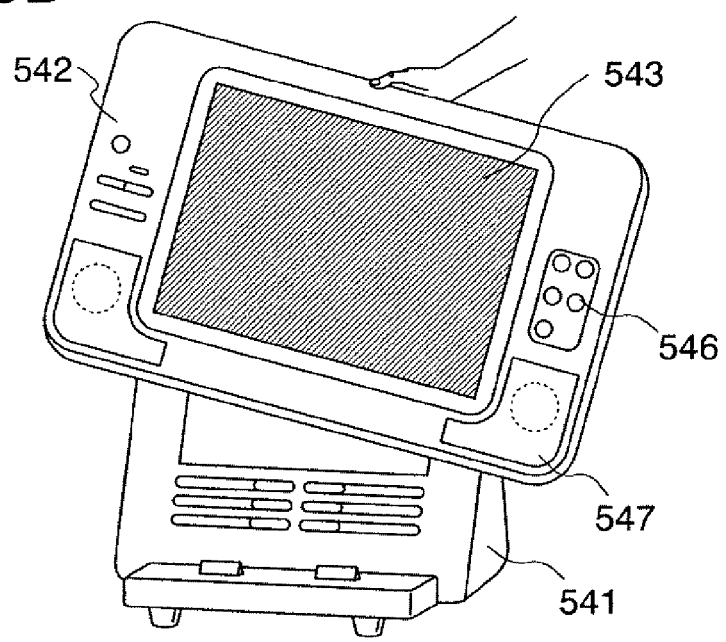

FIG. 19B illustrates a television receiver, only a display of which can be carried wirelessly. A battery and a signal receiver are incorporated in a housing 542. The battery drives a display portion 543 and speaker portions 547. The battery can be repeatedly charged with a charger 541. Further, the charger 541 can transmit and receive a video signal and can transmit the video signal to the signal receiver of the display. The housing 542 is controlled by operation keys 546. Further, the device shown in FIG. 19B may be an image audio two-way communication device which can transmit a signal to the charger 541 from the housing 542 by operating the operation keys 546. Still further, the device shown in FIG. 19B may be a general-purpose remote control device which can transmit a signal to the charger 541 from the housing 542 by operating the operation keys 546, and can control communication of another electronic device when the electronic device is made to receive a signal which can be transmitted from the charger 541.

A television receiver equipped with a high quality display device can be obtained by applying the present invention to the television receiver shown in FIG. 18 and FIGS. 19A to 19B.

As a matter of course, the present invention can be applied to various uses as a large display medium such as an information display board at a train station, an airport, or the like, or an advertisement display board on the street, as well as a monitor of a personal computer, without limitation to the TV receiver.

Figure 20A:
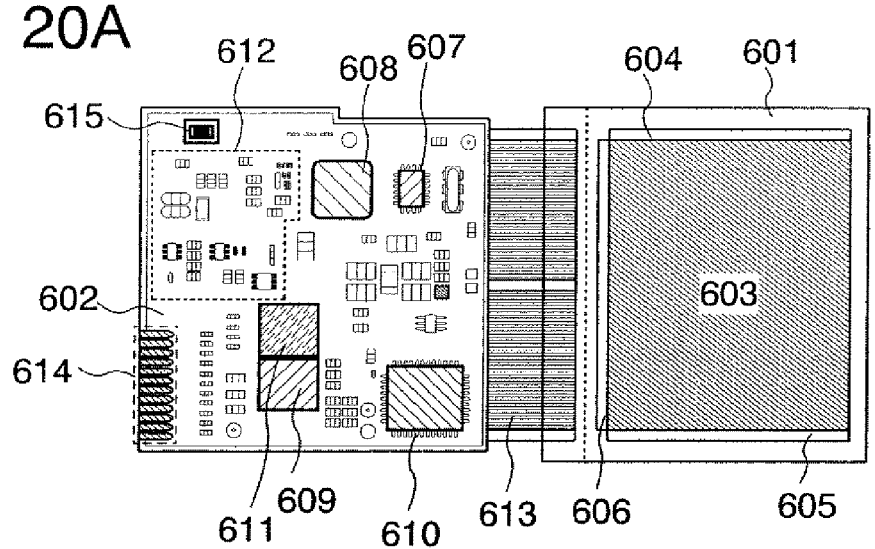
FIGS. 20A and 20B are a diagram of an electronic device of the present invention and a block diagram thereof, respectively.

FIG. 20A illustrates a module in which a liquid crystal display panel 601 formed using the present invention and a printed wiring board 602 are combined. The liquid crystal display panel 601 is provided with a pixel portion 603 including a plurality of pixels, a first scan line driver circuit 604, a second scan line driver circuit 605, and a signal line driver circuit 606 which supplies a video signal to a selected pixel. The liquid crystal display panel 601 may be manufactured based on Embodiment Mode 5.

The printed wiring board 602 is provided with a controller 607, a central processing unit (CPU) 608, a memory 609, a power supply circuit 610, an audio processing circuit 611, a transmitting/receiving circuit 612, and the like. The printed wiring board 602 and the liquid crystal display panel 601 are connected with a printed circuit (FPC) 613. The printed wiring board 602 may be provided with a storage capacitor element, a buffer circuit, or the like to prevent noise on power supply voltage or a signal, and signals from being dull, Note that the controller 607, the audio processing circuit 611, the memory 609, the CPU 608, the power supply circuit 610, and the like can be mounted on the liquid crystal display panel 601 by using a COG (chip on glass) method. When a COG method is used, the size of the printed wiring board 602 can be reduced.

Various control signals are input and output through an interface 614 provided for the printed wiring board 602. In addition, an antenna port 615 for transmitting and receiving a signal to/from an antenna is provided for the printed wiring board 602.

Figure 20B:
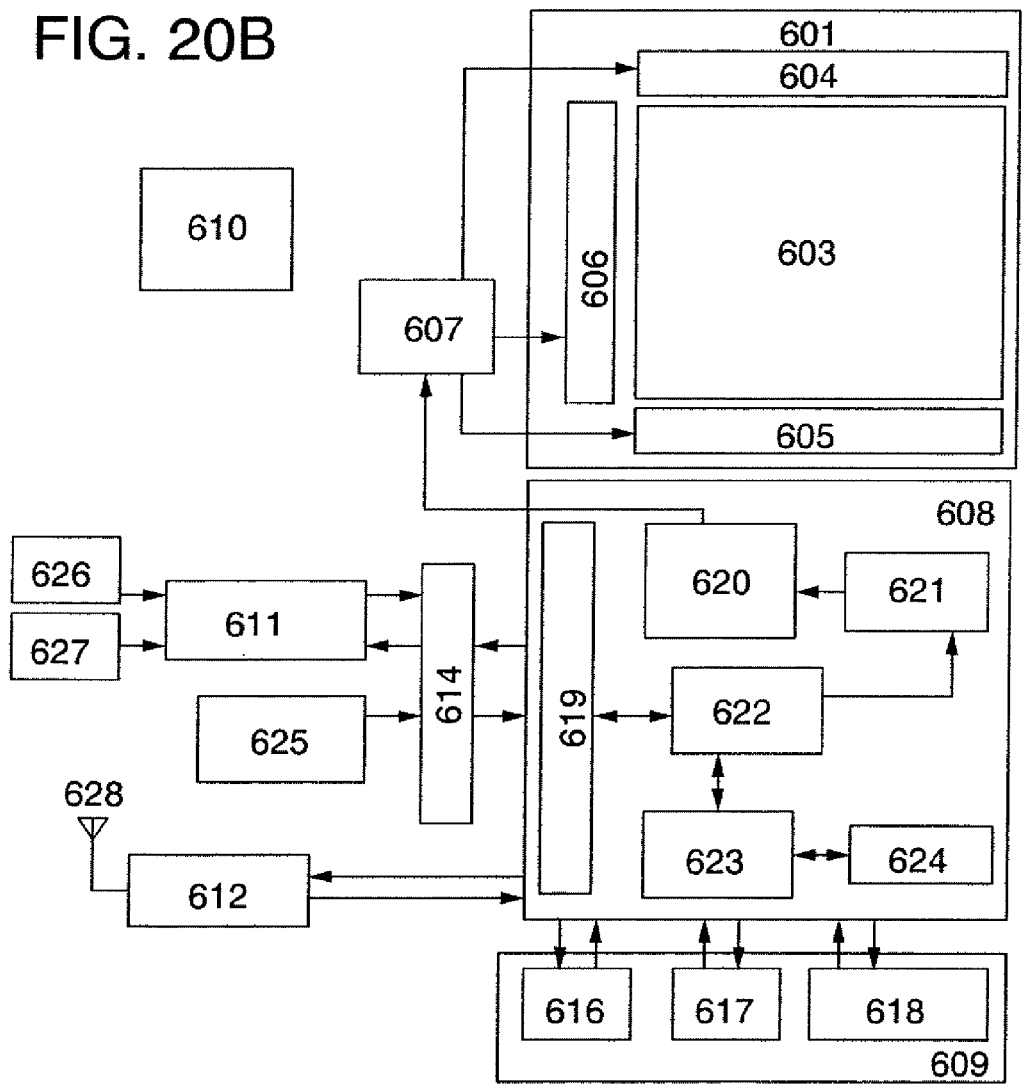

FIG. 20B is a block diagram of the module shown in FIG. 56A. The module includes a VRAM 616, a DRAM 617, a flash memory 618, and the like as the memory 609. The VRAM 616 stores data on an image displayed on the panel. The DRAM 617 stores video data or audio data. The flash memory 618 stores various programs.

The power supply circuit 610 supplies electric power for operating the liquid crystal display panel 601, the controller 607, the CPU 608, the audio processing circuit 611, the memory 609, and the transmitting/receiving circuit 612. Further, depending on panel specifications, the power supply circuit 610 is provided with a current source in some cases.

The CPU 608 includes a control signal generation circuit 620, a decoder 621, a register 622, an arithmetic circuit 623, a RAM 624, an interface 619 for the CPU 608, and the like. Various signals which are input to the CPU 608 through the interface 619 are once stored in the register 622, and then input to the arithmetic circuit 623, the decoder 621, and the like. The arithmetic circuit 623 performs operation based on the input signal to designate a location to which various instructions are sent. On the other hand, the signal input to the decoder 621 is decoded and input to the control signal generation circuit 620. The control signal generation circuit 620 generates a signal including various instructions based on the input signal, and transmits the signal to locations designated by the arithmetic circuit 623, specifically, the memory 609, the transmitting/receiving circuit 612, the audio processing circuit 611, the controller 607, and the like.

The memory 609, the transmitting/receiving circuit 612, the audio processing circuit 611, and the controller 607 operate in accordance with respective instructions. Operations thereof are briefly described below.

A signal input from an input means 625 is transmitted to the CPU 608 mounted on the printed wiring board 602 through the interface 614. The control signal generation circuit 620 converts image data stored in the VRAM 616 into a predetermined format based on the signal transmitted from the input means 625 such as a pointing device or a keyboard, and transmits the converted data to the controller 607.

The controller 607 performs data processing of the signal including the image data transmitted from the CPU 608 in accordance with the panel specifications, and supplies the signal to the liquid crystal display panel 601. Further, the controller 607 generates an Hsync signal, a Vsync signal, a clock signal CLK, alternating voltage (AC Cont), and a switching signal L/R based on power supply voltage input from the power supply circuit 610 or various signals input from the CPU 608, and supplies the signals to the liquid crystal display panel 601.

The transmitting/receiving circuit 612 processes a signal which is transmitted and received as a radio wave by an antenna 628. Specifically, the transmitting/receiving circuit 612 may include a high-frequency circuit such as an isolator, a band pass filter, a VCO (voltage controlled oscillator), an LPF (low pass filter), a coupler, or a balun. Among signals transmitted and received by the transmitting/receiving circuit 612, a signal including audio information is transmitted to the audio processing circuit 611 in accordance with an instruction from the CPU 608.

The signal including the audio information, which is transmitted in accordance with the instruction from the CPU 608, is demodulated into an audio signal by the audio processing circuit 611 and is transmitted to a speaker 627. Further, an audio signal transmitted from a microphone 626 is modulated by the audio processing circuit 611 and is transmitted to the transmitting/receiving circuit 612 in accordance with an instruction from the CPU 608.

The controller 607, the CPU 608, the power supply circuit 610, the audio processing circuit 611, and the memory 609 can be mounted as a package of this embodiment. This embodiment mode can be applied to any circuit other than high-frequency circuits such as an isolator, a band pass filter, a VCO (Voltage Controlled Oscillator), an OPF (Low Pass Filter), a coupler, and a balun.

Figure 21:
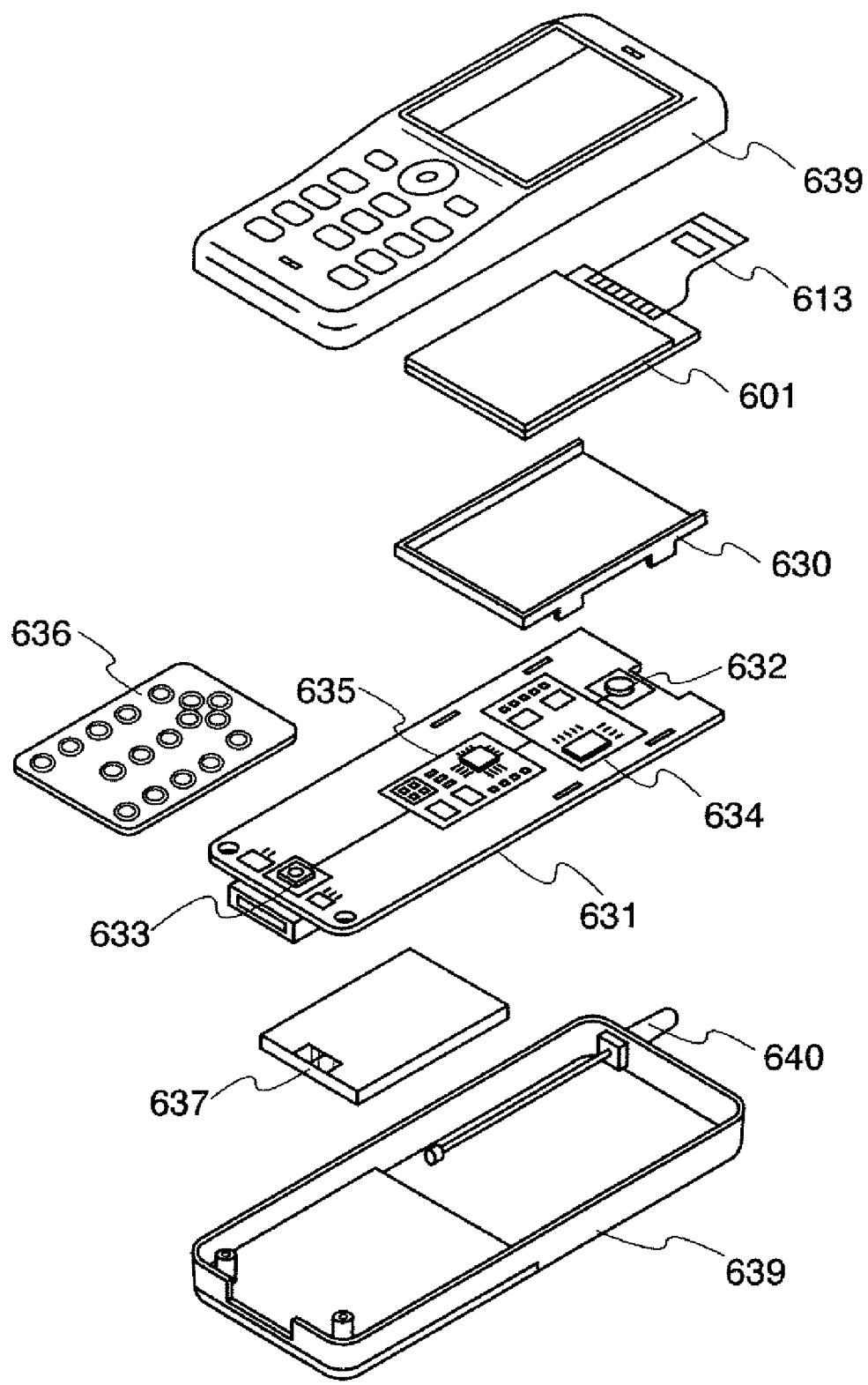
FIG. 21 illustrates an electronic device of the present invention.

FIG. 21 illustrates one mode of a mobile phone including the module shown in FIGS. 20A and 20B. A liquid crystal display panel 601 is incorporated in a housing 630 so as to be detachable. The shape and the size of the housing 630 can be changed as appropriate in accordance with the size of the liquid crystal display panel 601. The housing 630 to which the liquid crystal display panel 601 is fixed is fitted into a printed circuit board 631 and is assembled as a module.

The liquid crystal display panel 601 is connected to the printed circuit board 631 through an FPC 613. The printed circuit board 631 is provided with a speaker 632, a microphone 633, a transmitting/receiving circuit 634, and a signal processing circuit 635 including a CPU, a controller, and the like. Such a module, an input means 636, a battery 637, and an antenna 640 are combined and stored in a housing 639. A pixel portion of the liquid crystal display panel 601 is provided so as to be seen through an opening window formed in the housing 639.

The cellular phone according to this embodiment mode can be changed in various ways in accordance with the functions or the uses. For example, the above effect can be obtained even in a case of employing a structure in which a plurality of display panels is provided and a housing is divided into multiple pieces as appropriate to be opened and closed using a hinge.

Applying the present invention to the cellular phone shown in FIGS. 20A and 20B and FIG. 21, a cellular phone with a high-quality display device can be obtained.

Figure 22A:
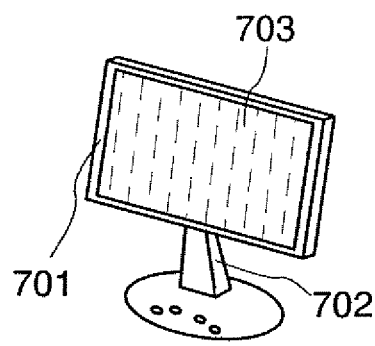
FIGS. 22A to 22E each illustrate an electronic device of the present invention.

FIG. 22A illustrates a liquid crystal display, which includes a housing 701, a supporting base 702, a display portion 703, and the like. The display portion 703 is manufactured using the liquid crystal display device described in Embodiment Mode 5. By using the present invention, a liquid crystal display provided with a high-quality display device can be obtained.

Further, the transistor or the CMOS circuit which are described in Embodiment Mode 5 can be applied to a control circuit area or the like.

Figure 22B:
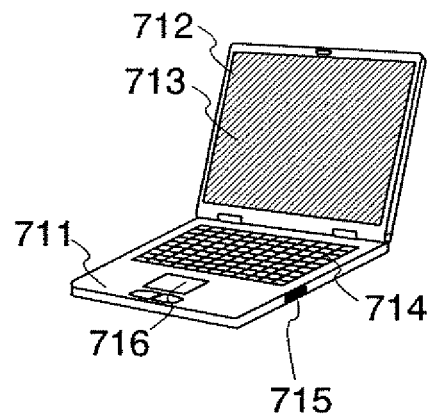

FIG. 22B is a computer, which includes a main body 711, a housing 712, a display portion 713, a keyboard 714, an external connection port 715, a pointing device 716, and the like. The display portion 713 is manufactured using a liquid crystal device described in Embodiment Mode 5. By using the present invention, a computer provided with a high-quality display device can be obtained.

Further, the transistor or the CMOS circuit which are described in Embodiment Mode 5 can be applied to a control circuit area or the like.

Figure 22C:
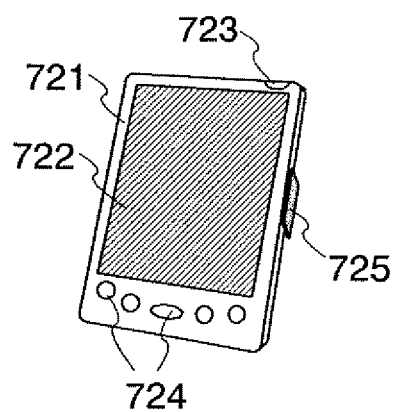

FIG. 22C shows a portable computer, which includes a main body 721, a display portion 722, a switch 723, operation keys 724, an infrared port 725, and the like. The display portion 722 is manufactured using the liquid crystal described in Embodiment Mode 5. By using the present invention, a computer provided with a high-quality display device can be obtained.

Further, the transistor or the CMOS circuit which are described in Embodiment Mode 5 can be applied to a control circuit area or the like.

Figure 22D:
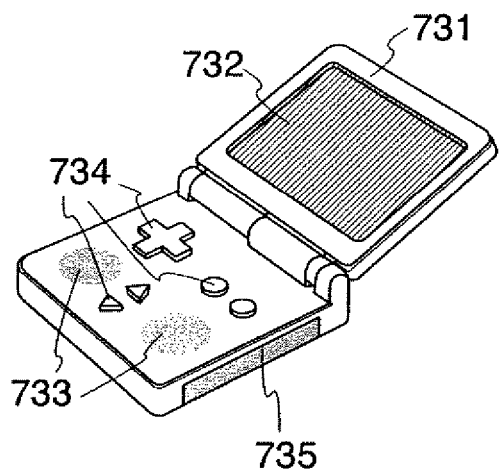

FIG. 22D shows a portable game machine, which includes a housing 731, a display portion 732, a speaker portion 733, operation keys 734, a recording medium insert portion 735, and the like. The display portion 732 is manufactured using the liquid crystal described in Embodiment Mode 5. By using the present invention, a game machine provided with a high-quality display device can be obtained.

Further, the transistor or the CMOS circuit which are described in Embodiment Mode 5 can be applied to a control circuit area or the like.

Figure 22E:
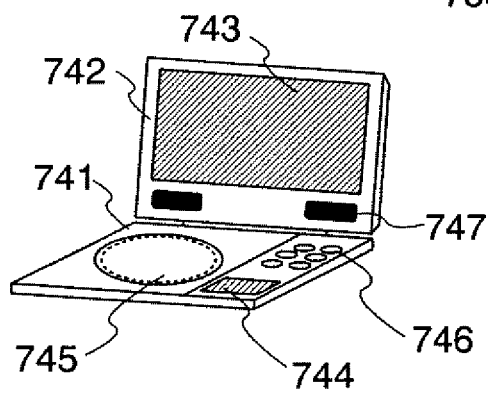

FIG. 22E illustrates a portable image reproducing device, which includes a recording medium (specifically, a DVD reproducing device), which includes a main body 741, a housing 742, a display portion A 743, a display portion B 744, a recording medium, a reading portion 745, operation keys 746, a speaker portion 747, and the like. A recording medium refers to a DVD or the like. The display portion A 743 mainly displays image data while the display portion B 744 mainly displays text data. The display portion A 743 and the display portion B 744 are manufactured using the liquid crystal display device described in Embodiment Mode 5. It is to be noted that an image reproducing device provided with a recording medium also includes a home game machine and the like. By using the present invention, an image reproducing device provided with a high-quality display device can be obtained.

Further, the transistor or the CMOS circuit which are described in Embodiment Mode 5 can be applied to a control circuit area or the like.

Figure 23A:
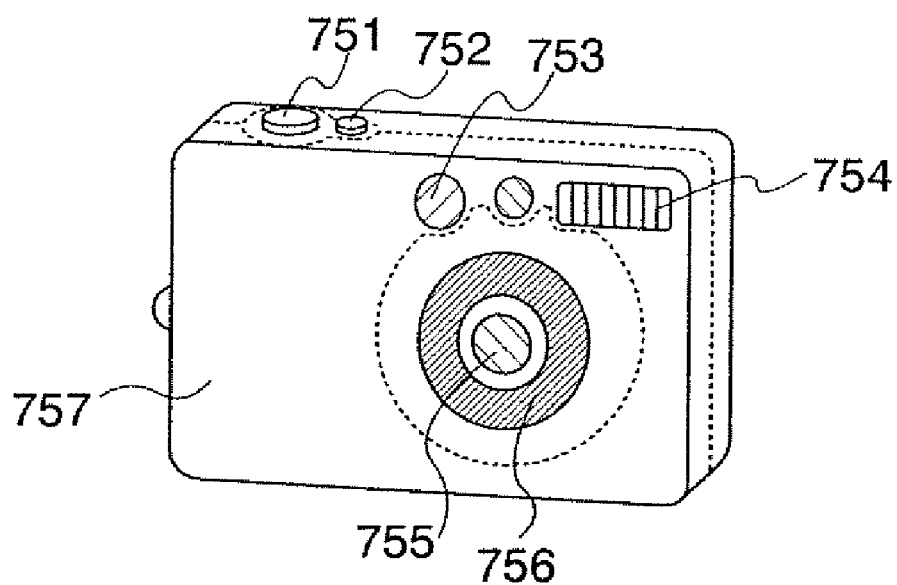
FIGS. 23A and 23B illustrate an electronic device of the present invention.
Figure 23B:
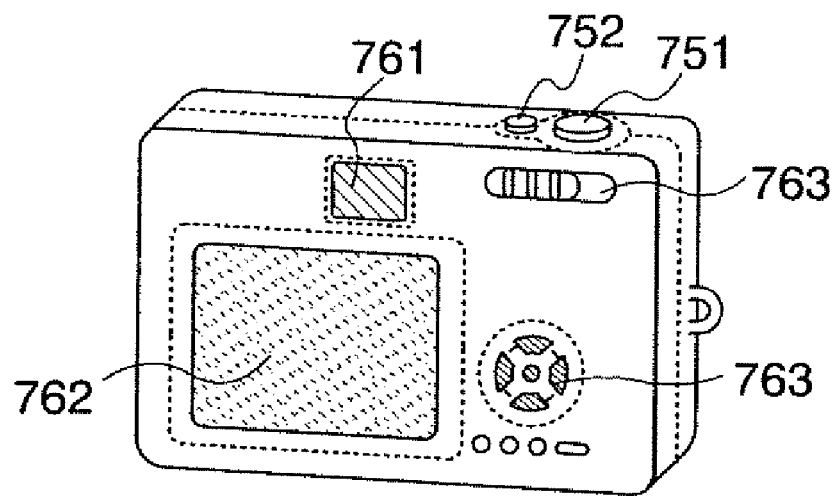

FIGS. 23A and 23B are views each showing an example in which the liquid crystal display device of the present invention is incorporated in a camera, for example, a digital camera. FIG. 23A is a perspective view seen from front side of a digital camera, and FIG. 23B is a perspective view seen from back side of the digital camera. In FIG. 23A, the digital cameral is provided with a release button 751, a main switch 752, a viewfinder 753, a flash portion 754, a lens 755, a barrel 756, and a housing 757.

In FIG. 23B, an eyepiece finder 761, a monitor 762, and operation buttons 763 are provided.

When the release button 751 is pushed down to the half point, a focus adjustment mechanism and an exposure adjustment mechanism are operated, and when the release button is pushed down to the lowest point, a shutter is opened.

By pushing down or rotating the main switch 752, a power supply of the digital camera is switched on or off.

The viewfinder 753 is arranged above the lens 755, which is on the front side of the digital camera, for checking a shooting range and the focus point from the eyepiece finder 761 shown in FIG. 23B.

The flash portion 754 is arranged in the upper position on the front side of the digital camera. When the subject brightness is not enough, auxiliary light is emitted from the flash portion 754, at the same time as the release button 751 is pushed down and a shutter is opened.

The lens 755 is arranged at the front side of the digital camera and made of a focusing lens, a zoom lens, and the like. The lens forms a photographic optical system with a shutter and a diaphragm, which are not shown. In addition, behind the lens, an imaging device such as a CCD (Charge Coupled Device) is provided.

The barrel 756 moves a lens position to adjust the focus of the focusing lens, the zoom lens, and the like. In shooting, the barrel is slid out to move the lens 755 forward. Further, when carrying the digital camera, the lens 755 is moved backward to be compact. It is to be noted that a structure is employed in this embodiment, in which the subject can be photographed by zoom by sliding out the barrel; however, the present invention is not limited to this structure, and a structure may also be employed for the digital camera, in which shooting can be performed by zoom without sliding out the barrel with the use of a structure of a photographic optical system inside the housing 757.

The eyepiece finder 761 is arranged in the upper position on the back side of the digital camera for looking therethrough in checking a shooting range and the focus point.

The operation buttons 763 are buttons for various functions provided on the back side of the digital camera, which includes a set up button, a menu button, a display button, a functional button, a selecting button, and the like.

The liquid crystal display device described in Embodiment Mode 5 can be incorporated in a monitor 762 of the camera shown in FIGS. 23A and 23B. Accordingly, a digital camera provided with a high-quality display device can be obtained.

Further, the transistor or the CMOS circuit which are described in Embodiment Mode 5 can be applied to a control circuit area or the like.

Figure 28A:
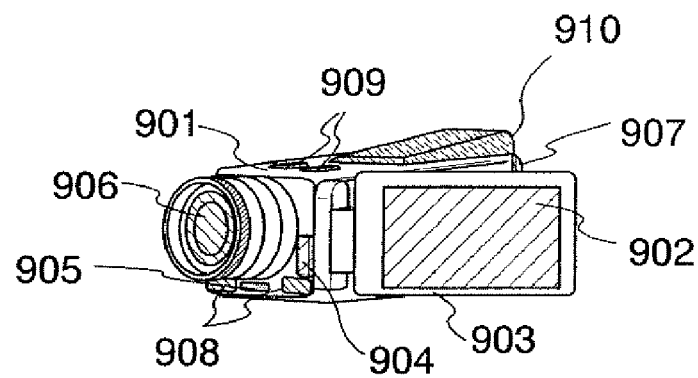
FIGS. 28A to 28C illustrate electronic devices of the present invention.

FIG. 28A is a video camera, which includes a main body 901, a display portion 902, a housing 903, an external connection port 904, a remote control receiving portion 905, an image receiving portion 906, a battery 907, an audio input portion 908, operation keys 909, an eyepiece portion 910, and the like.

The liquid crystal display device described in Embodiment Mode 5 or the light emitting device described in Embodiment Mode 6 can be applied to the display portion 902, and display with high image quality can be performed.

Further, the transistor or the CMOS circuit which are described in Embodiment Mode 5 can be applied to a control circuit area or the like.

Figure 28B:
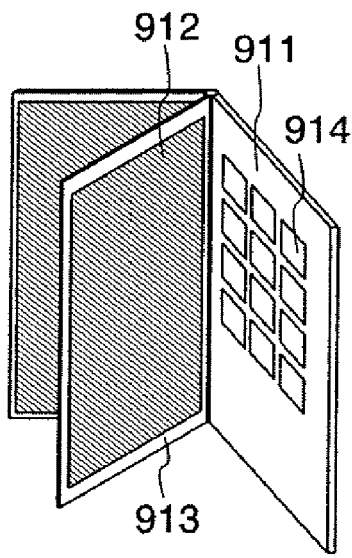

FIG. 28B is an electronic book, which includes a main body 911, a display portion 912, a chassis 913, an operation switch 914, and the like. Further, a modem may be built in, or a structure capable of wirelessly transmitting and receiving data may be employed. Note that a memory portion of the electronic book uses a NOR-type nonvolatile memory with a memory capacity of 20 gigabytes (GB) to 200 gigabytes (GB), and is capable of recording reproducing images or sounds (music).

The microprocessor described in Embodiment Mode 7, the RFCPU described in Embodiment Mode 8, or the like can be applied to the memory portion for storing data of the electronic book, or a microprocessor for operating the electronic book. Further, the liquid crystal display device described in Embodiment Mode 5 or the light emitting device described in Embodiment Mode 6 can be used in the display portion 912, display with high image quality can be performed.

Further, the transistor or the CMOS circuit which are described in Embodiment Mode 5 can be applied to a control circuit area or the like.

Figure 28C:
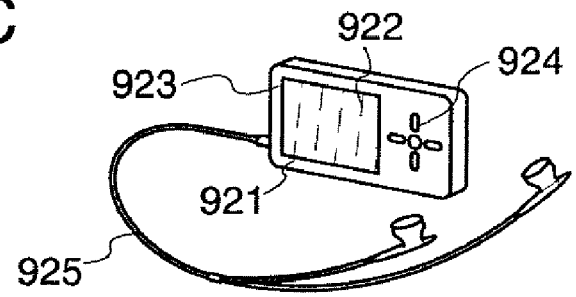

FIG. 28C is a digital player, which is a typical example of an audio device, which includes a main body 921, a display portion 922, a chassis 923, an operation switch 924, earphones 925, and the like. A headphone or wireless earphones can be used instead of the earphones 925.

The microprocessor described in Embodiment Mode 7, the RFCPU described in Embodiment Mode 8, or the like can be applied to the memory portion for storing music data or a microprocessor for operating the digital player. The digital player can be miniaturized and made lighter; the liquid crystal display device described in Embodiment Mode 5 or the light emitting device described in Embodiment Mode 6 is applied to a display portion 922, high definition image or text can be displayed even if the screen size is approximately 0.3 inches to 2 inches This application is based on Japanese Patent Application serial no. 2007-280115 filed with Japan Patent Office on Oct. 29, 2007, the entire contents of which are hereby incorporated by reference.

REFERENCE NUMERALS

100: silicon ingot, 101: first porous silicon layer, 102: second porous silicon layer, 103: epitaxial layer, 104: groove, 105: ingot, 111: receptacle, 112: electrode, 113: mixed solution, 115: current source, 120: large insulating substrate, 121: first insulating film, 122: second insulating film, 123: third insulating film, 124: substrate, 130: water jet, 135: arrow, 141: crimping roller, 142: arrow, 143: arrow, 144: arrow, 145: hydrogen ions, 146: hydrogen ion irradiation region, 147: planarization apparatus, 151: single crystal silicon layer, 161: crystal orientation, 162: crystal orientation, 163: arrow, 171: active layer, 172: gate electrode, 181: region, 182: region, 183: channel formation region, 201: crucible, 202: material, 203: liquid melt, 204: partitions, 205: rectangular column ingot, 206: circular cylindrical silicon ingot 206, 211: arrow, 301: substrate, 302: crystalline silicon layer, 304: semiconductor island region, 305: semiconductor island region, 306: semiconductor island region, 308: gate insulating film, 311: gate electrode, 312: gate electrode, 313: gate electrode, 315:

gate electrode, 316: gate electrode, 317: gate electrode, 321: impurity element, 322: impurity element, 324: impurity element, 325: impurity element, 326: impurity element, 326: impurity element, 331: channel formation region, 332a: impurity region, 332b: impurity region, 333: channel formation region, 334a: impurity region, 334b: impurity region, 335: channel formation region, 336a: impurity region, 336b: impurity region, 337: resist mask, 338: resist mask, 339: resist mask, 342a: high-concentration impurity region, 342b: high-concentration impurity region, 343a: low-concentration impurity region, 343b: low-concentration impurity region, 344a: high-concentration impurity region, 344b: high-concentration impurity region, 345a: low-concentration impurity region, 345b: low-concentration impurity region, 346a: high-concentration impurity region, 346b: high-concentration impurity region, 347a: low-concentration impurity region, 347b: low-concentration impurity region, 351: protective film, 352: interlayer insulating film, 355: resist mask, 356: resist mask, 357: resist mask, 361: wiring, 362: wiring, 363: wiring, 364: wiring, 365: wiring, 371: transistor, 372: transistor, 373: CMOS circuit, 374: transistor, 381a: sidewall, 381b: sidewall, 382a: sidewall, 382b: sidewall, 383a: sidewall, 383b: sidewall, 392a: high-concentration impurity region, 392b: high-concentration impurity region, 393a: low-concentration impurity region, 393b: low-concentration impurity region, 394a: high-concentration impurity region, 394b: high-concentration impurity region, 395a: low-concentration impurity region, 395b: low-concentration impurity region, 396a: high-concentration impurity region, 396b: high-concentration impurity region, 397a: low-concentration impurity region, 397b: low-concentration impurity region, 401: pixel electrode, 402: alignment layer, 411: counter substrate, 412: light blocking layer, 413: color layer, 414: overcoat layer, 415: counter electrode, 416: alignment layer, 421: liquid crystal display panel, 422: pixel portion, 423: scan line driver circuit, 424: signal line driver circuit, 431: circuit substrate, 432: control circuit, 433: signal separation circuit, 434: connection wiring, 501: liquid crystal display panel, 502: pixel portion, 503: scan line driver circuit, 504: signal line driver circuit, 512: control circuit, 513: signal separation circuit, 521: tuner, 522: video signal amplifier circuit, 523: video signal processing circuit, 525: audio signal amplifier circuit, 526: audio signal processing circuit, 527: speaker, 528: control circuit, 529: input portion, 531: housing, 532: display screen, 533: speakers, 534: operation switches, 541: charger, 542: housing, 543: display portion, 546: operation keys, 547: speaker portions, 601: liquid crystal display panel, 602: printed wiring board, 603: pixel portion, 604: scan line driver circuit, 605: scan line driver circuit, 606: signal line driver circuit, 607: controller, 608: CPU, 609: memory, 610: power supply circuit, 611: audio processing circuit, 612: transmitting/receiving circuit, 613: FPC, 614: interface, 615: antenna port, 616: VRAM, 617: DRAM, 618: flash memory, 619: interface, 620: control signal generation circuit, 621: decoder, 622: register, 623: arithmetic circuit, 624: RAM, 625: input means, 626: microphone, 627: speaker, 628: antenna, 630: housing, 631: printed circuit board, 632: speaker, 633: microphone, 634: transmitting/receiving circuit, 635: signal processing circuit, 636: input means, 637: battery, 639: housing, 640: antenna, 701: housing, 702: supporting base, 703: display portion, 711: body, 712: housing, 713: display portion, 714: keyboard, 715: external connection port, 716: pointing device, 721: body, 722: display portion, 723: switch, 724: operation keys, 725: infrared port, 731: housing, 732: display portion, 733: speaker portion, 734: operation keys, 735: recording medium insert portion, 741: body, 742: housing, 743: display portion A, 744: display portion B, 745: reading portion, 746: operation keys, 747: speaker portion, 751: release button, 752: main switch, 753: viewfinder, 754: flash portion, 755: lens, 756: barrel, 757: housing, 761: eyepiece finder, 762: monitor, 763: operation buttons, 800: microprocessor, 801: ALU, 802: ALU controller, 803: instruction decoder, 804: interrupt controller, 805: timing controller, 806: register, 807: register controller, 808: bus interface, 809: read only memory, 810: memory interface, 821: RFCPU, 822: analog circuit portion, 823: digital circuit portion, 824: resonant circuit, 825: rectifier circuit, 826: constant voltage circuit, 827: reset circuit, 828: oscillator circuit, 829: demodulation circuit, 830: modulation circuit, 831: RF interface, 832: control register, 833: clock controller, 834: CPU interface, 835: CPU, 836: RAM, 837: ROM, 838: antenna, 839: capacitor portion, 840: power supply control circuit, 851: selection transistor, 852: current line, 853: display control transistor, 854: partition layer, 855: light-emitting layer, 856: counter electrode, 857: sealing resin, 858: counter substrate, 859: electrode, 860: electrode, 871: substrate, 879: semiconductor film, 880: gate wiring, 882: signal line, 883: pixel electrode, 884: gate insulating film, 885: gate electrode, 887: interlayer insulating film, 901: body, 902: display portion, 903: housing, 904: external connection port, 905: remote control receiving portion, 906: image receiving portion, 907: battery, 908: audio input portion, 909: operation keys, 910: eyepiece portion, 911: body, 912: display portion, 913: chassis, 914: operation switch, 921: body, 922: display portion, 923: chassis, 924: operation switch, 925: earphones, 1100: crystalline silicon ingot, 1151: crystalline silicon layer, and 1251: polycrystalline silicon layer electrode

What is claimed is:

1. A method for forming a semiconductor device, comprising the steps of:
    irradiating a side surface of a cylindrical crystalline semiconductor ingot with ions, to form an ion irradiation region therein;
    wrapping at least a part of the side surface of the cylindrical crystalline semiconductor ingot with an insulating substrate; and
    separating the insulating substrate from the cylindrical crystalline semiconductor ingot along the ion irradiation region to allow a crystalline semiconductor layer to be left over the insulating substrate.

2. The method according to claim 1, wherein the insulating substrate is bendable.

3. The method according to claim 1, wherein the insulating substrate is a glass substrate, a semiconductor substrate, or a plastic substrate.

4. The method according to claim 1, wherein the ions are hydrogen ions.

5. The method according to claim 1, wherein the cylindrical crystalline semiconductor ingot comprises silicon or germanium.

6. The method according to claim 1, wherein the cylindrical crystalline semiconductor ingot comprises an oxide semiconductor.

7. The method according to claim 1, further comprising a step of:
    forming an insulating film over the insulating substrate, wherein the wrapping is performed so that the insulating film is interposed between the side surface and the insulating substrate.

8. A method for forming a semiconductor device, comprising the steps of:
    irradiating a side surface of a cylindrical crystalline semiconductor ingot with ions to form an ion irradiation region therein while rotating the cylindrical crystalline semiconductor ingot along a central axis thereof;

wrapping at least a part of the side surface of the cylindrical crystalline semiconductor ingot with an insulating substrate; and separating the insulating substrate from the cylindrical crystalline semiconductor ingot along the ion irradiation region to allow a crystalline semiconductor layer to be left over the insulating substrate.

9. The method according to claim 8,
wherein the insulating substrate is bendable.

10. The method according to claim 8,
wherein the insulating substrate is a glass substrate, a semiconductor substrate, or a plastic substrate.

11. The method according to claim 8,
wherein the ions are hydrogen ions.

12. The method according to claim 8,
wherein the cylindrical crystalline semiconductor ingot comprises silicon or germanium.

13. The method according to claim 8,
wherein the cylindrical crystalline semiconductor ingot comprises an oxide semiconductor.

14. The method according to claim 8, further comprising a step of:
forming an insulating film over the insulating substrate,
wherein the wrapping is performed so that the insulating film is interposed between the side surface and the insulating substrate.

15. A method for forming a semiconductor device, comprising the steps of:
irradiating a side surface of a cylindrical crystalline semiconductor ingot with ions to form an ion irradiation region therein while rotating the cylindrical crystalline semiconductor ingot along a central axis thereof;

wrapping at least a part of the side surface of the cylindrical crystalline semiconductor ingot with an insulating substrate; and separating the insulating substrate from the cylindrical crystalline semiconductor ingot along the ion irradiation region, while heating the insulating substrate and the cylindrical crystalline semiconductor ingot, to allow a crystalline semiconductor layer to be left over the insulating substrate.

16. The method according to claim 15,
wherein the insulating substrate is bendable.

17. The method according to claim 15,
wherein the insulating substrate is a glass substrate, a semiconductor substrate, or a plastic substrate.

18. The method according to claim 15,
wherein the ions are hydrogen ions.

19. The method according to claim 15,
wherein the cylindrical crystalline semiconductor ingot comprises silicon or germanium.

20. The method according to claim 15,
wherein the cylindrical crystalline semiconductor ingot comprises an oxide semiconductor.

21. The method according to claim 15, further comprising a step of:
forming an insulating film over the insulating substrate,
wherein the wrapping is performed so that the insulating film is interposed between the side surface and the insulating substrate.

* * * * *